United States Patent
Zhang et al.

(10) Patent No.: US 12,089,447 B2
(45) Date of Patent: Sep. 10, 2024

(54) DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Shun Zhang, Beijing (CN); Yang Zhou, Beijing (CN); Tinghua Shang, Beijing (CN); Huijuan Yang, Beijing (CN); Tingliang Liu, Beijing (CN); Siyu Wang, Beijing (CN); Mengqi Wang, Beijing (CN); Yu Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 433 days.

(21) Appl. No.: 17/622,799

(22) PCT Filed: Mar. 25, 2020

(86) PCT No.: PCT/CN2020/081236
§ 371 (c)(1),
(2) Date: Dec. 25, 2021

(87) PCT Pub. No.: WO2021/189335
PCT Pub. Date: Sep. 30, 2021

(65) Prior Publication Data
US 2022/0254855 A1    Aug. 11, 2022

(51) Int. Cl.
*H10K 59/12*    (2023.01)
*H10K 59/121*    (2023.01)
*H10K 59/122*    (2023.01)
*H10K 59/131*    (2023.01)
*H10K 59/88*    (2023.01)

(52) U.S. Cl.
CPC ..... *H10K 59/1213* (2023.02); *H10K 59/1216* (2023.02); *H10K 59/122* (2023.02); *H10K 59/131* (2023.02); *H10K 59/88* (2023.02)

(58) Field of Classification Search
CPC ............ H10K 59/1213; H10K 59/122; H10K 59/131; H10K 59/88; H10K 59/1216
(Continued)

(56) References Cited

U.S. PATENT DOCUMENTS 10,453,396 B2    10/2019  Koong
2002/0030184 A1*   3/2002  Wu .................. G02F 1/136286
                                              257/289
(Continued)

FOREIGN PATENT DOCUMENTS

CN    103676381 A    3/2014
CN    105789250 A    7/2016
(Continued)

OTHER PUBLICATIONS

The Extended European Search Report dated Apr. 21, 2023; Appln. No. 20927098.2.

*Primary Examiner* — Phuc T Dang

(57) ABSTRACT

Provided is a display panel, including a display pixel unit located in a display region, the display pixel unit including a threshold compensation transistor, the threshold compensation transistor including a first channel and a second channel being connected by a conductive connection portion; a dummy pixel unit located in a dummy region; a first signal line located in the dummy region and configured to provide a constant voltage; and a first conductive block connected to the first signal line. The display pixel unit includes a first display pixel unit, the first display pixel unit is a display pixel unit adjacent to the dummy pixel unit in a row direction, and in a plan view of the display panel, the first conductive block at least partially overlaps the conduc- (Continued)

tive connection portion of the threshold compensation transistor of the first display pixel unit. A display device is further provided.

20 Claims, 20 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2005/0140274 A1* | 6/2005 | Lee | H10K 59/122 |
| | | | 313/504 |
| 2016/0320647 A1* | 11/2016 | Shin | G02F 1/136227 |
| 2018/0247597 A1 | 8/2018 | An et al. | |
| 2020/0027939 A1 | 1/2020 | Cho et al. | |
| 2020/0044009 A1 | 2/2020 | Kwak et al. | |

FOREIGN PATENT DOCUMENTS

| | | | | |
|---|---|---|---|---|
| CN | 108022553 | A | 5/2018 | |
| CN | 108428434 | A | 8/2018 | |
| CN | 108470539 | A | 8/2018 | |
| CN | 110729324 | A | 1/2020 | |
| EP | 3 273 436 | A2 | 1/2018 | |
| EP | 3 300 067 | A2 | 3/2018 | |
| EP | 3 401 959 | A1 | 11/2018 | |
| EP | 3671712 | A1 * | 6/2020 | ......... H10K 59/1213 |
| KR | 20210118301 | A1 * | 9/2021 | |

\* cited by examiner

DISPLAY PANEL AND DISPLAY DEVICE

TECHNICAL FIELD

Embodiments of the present disclosure relate to a display panel and a display device.

BACKGROUND

In recent years, the active-matrix organic light-emitting diode (AMOLED) has developed rapidly in the display field, and has been used more and more widely. At the same time, consumers have higher and higher requirements for the display effect of display devices.

SUMMARY

Embodiments of the present disclosure provide a display panel and a display device.

Embodiments of the present disclosure provide a display panel, including: a display pixel unit located in a display region, the display pixel unit including a first transistor, the first transistor including a first channel and a second channel, the first channel and the second channel being connected by a conductive connection portion; a dummy pixel unit located in a dummy region, the dummy region being at a side of the display region and being a non-light-emitting region; a first signal line located in the dummy region, the first signal line being configured to supply a constant voltage; and a first conductive block connected with the first signal line; the display pixel unit includes a first display pixel unit, the first display pixel unit is a display pixel unit adjacent to the dummy pixel unit in a row direction, and in a plan view of the display panel, the first conductive block at least partially overlaps with the conductive connection portion of the first transistor of the first display pixel unit.

According to the display panel provided by some embodiments of the present disclosure, the dummy pixel unit is not provided with the first transistor.

According to the display panel provided by some embodiments of the present disclosure, the display panel further includes an interlayer insulating layer, the interlayer insulating layer is located between the first conductive block and the first signal line, and the first conductive block is connected with the first signal line through a via hole penetrating the interlayer insulating layer.

According to the display panel provided by some embodiments of the present disclosure, the display panel further includes: a first power line located in the display region and in a same layer as the first signal line; and a second conductive block located in the display region and in a same layer as the first conductive block, the second conductive block being connected with the first power line; the display pixel unit includes a second display pixel unit, the second display pixel unit is located at a side of the first display pixel unit away from the dummy pixel unit, in a plan view of the display panel, the second conductive block at least partially overlaps with the conductive connection portion of the first transistor of the second display pixel unit, and the first signal line and the first power line are arranged in a first direction, the first signal line and the first power line both extend in a second direction, and a size of the first conductive block in the second direction is less than or equal to a size of the second conductive block in the second direction.

According to the display panel provided by some embodiments of the present disclosure, the first signal line is connected with the first power line, and the first power line is configured to supply the constant voltage to the display pixel unit.

According to the display panel provided by some embodiments of the present disclosure, the second direction intersects with the first direction.

According to the display panel provided by some embodiments of the present disclosure, the display panel further includes a gate line and a first reset control signal line, the first transistor further includes a first gate electrode and a second gate electrode, the first gate electrode and the second gate electrode are connected with the gate line, respectively, and the first gate electrode and the second gate electrode overlap with the first channel and the second channel, respectively, in a direction perpendicular to the display panel, the gate line and the first reset control signal line both extend in a first direction, the first display pixel unit is a display pixel unit closest to an edge of the display panel in the first direction, the first reset control signal line and the gate line are arranged in a second direction, the first reset control signal line is closer to an edge of the display panel than the gate line, the first direction intersects with the second direction, and a length of the first reset control signal line in the first direction is less than or equal to a length of the gate line in the first direction.

According to the display panel provided by some embodiments of the present disclosure, the display panel further includes a conductive adapter, the conductive adapter is connected with the first reset control signal line, and the conductive adapter is located in a same layer as the first signal line.

According to the display panel provided by some embodiments of the present disclosure, the display panel further includes an initialization signal line, the initialization signal line extends in a first direction, and the first conductive block is located in a same layer as the initialization signal line.

According to the display panel provided by some embodiments of the present disclosure, the display panel further includes a pixel definition layer, the pixel definition layer has an opening in the display region, the opening is configured to define a light-emitting region of the display pixel unit, and the pixel definition layer is not provided with an opening for the dummy pixel unit.

According to the display panel provided by some embodiments of the present disclosure, the display panel further includes an anode layer, the anode layer includes an anode, the display pixel unit has the anode, and the dummy pixel unit is not provided with an anode.

According to the display panel provided by some embodiments of the present disclosure, the first display pixel unit is located at a side edge of the display panel or at a corner of the display panel.

According to the display panel provided by some embodiments of the present disclosure, the display panel further includes a driving transistor, a first electrode of the first transistor is electrically connected with a second electrode of the driving transistor, a second electrode of the first transistor is electrically connected with a gate electrode of the driving transistor, and a gate electrode of the first transistor is electrically connected with a gate line.

According to the display panel provided by some embodiments of the present disclosure, the display panel further includes a gate line, a data line, a light-emitting control signal line, a first power line, a second power line, a first reset control signal line, a second reset control signal line, a first initialization signal line, and a second initialization signal line, the display pixel unit further includes a light-emitting element, a data writing transistor, a first light-emitting control transistor, a second light-emitting control transistor, a first reset transistor, a second reset transistor, and a storage capacitor, a first electrode of the storage capacitor is electrically connected with the first power line, and a second electrode of the storage capacitor is electrically connected with the second electrode of the first transistor; a gate electrode of the data writing transistor is electrically connected with the gate line, and a first electrode and a second electrode of the data writing transistor are electrically connected with the data line and the first electrode of the driving transistor, respectively; the gate electrode of the first transistor is electrically connected with the gate line, the first electrode of the first transistor is electrically connected with the second electrode of the driving transistor, and the second electrode of the first transistor is electrically connected with the gate electrode of the driving transistor; a gate electrode of the first light-emitting control transistor and a gate electrode of the second light-emitting control transistor are both connected with the light-emitting control signal line; a first electrode and a second electrode of the first light-emitting control transistor are electrically connected with the first power line and the first electrode of the driving transistor, respectively; a first electrode and a second electrode of the second light-emitting control transistor are electrically connected with the second electrode of the driving transistor and the first electrode of the light-emitting element, respectively; and the second electrode of the light-emitting element is electrically connected with the second power line; a gate electrode of the first reset transistor is electrically connected with the first reset control signal line, a first electrode of the first reset transistor is electrically connected with the first initialization signal line, and a second electrode of the first reset transistor is electrically connected with the gate electrode of the driving transistor; a gate electrode of the second reset transistor is electrically connected with the second initialization signal line, a first electrode of the second reset transistor is electrically connected with the second initialization signal line, and a second electrode of the second reset transistor is electrically connected with the first electrode of the light-emitting element.

According to the display panel provided by some embodiments of the present disclosure, the dummy pixel unit is not provided with at least one of the first reset transistor and the second reset transistor.

According to the display panel provided by some embodiments of the present disclosure, the display panel further includes a first lead wire and a second lead wire, the first lead wire and the second lead wire are located at a side of the dummy pixel unit away from the display pixel unit, the first lead wire is connected with the gate line and the second reset control signal line, respectively, and the second lead wire is connected with the light-emitting control signal line.

According to the display panel provided by some embodiments of the present disclosure, the display panel further includes a gate insulating layer, the gate insulating layer is located between the first conductive block and the conductive connection portion as a dielectric of a capacitor formed by the first conductive block and the conductive connection portion.

At least one embodiment of the present disclosure provides a display device including any one of the display panels described above.

BRIEF DESCRIPTION OF THE DRAWINGS

In order to more clearly illustrate the technical solutions of the embodiments of the present disclosure, the drawings of the embodiments will be briefly described in the following; it is obvious that the described drawings below are only related to some embodiments of the present disclosure and thus are not construed as any limitation to the present disclosure.

DETAILED DESCRIPTION

In order to make objects, technical details and advantages of the embodiments of the present disclosure more clear, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the described object is changed, the relative position relationship may be changed accordingly.

When designing an active matrix organic light-emitting diode display panel, dummy pixel units with different numbers are usually designed around the display region to ensure etching uniformity, that is, the pixel units located in the display region close to the edge of the display panel and the pixel units located in the middle region of the display region have signal wires of the same line width and the same line pitch, thus avoiding abnormal display of pixel units located in the display region close to the edge of the display panel. The dummy pixel unit is usually formed by omitting a part of the circuit structure of the normal pixel unit.

Figure 1:
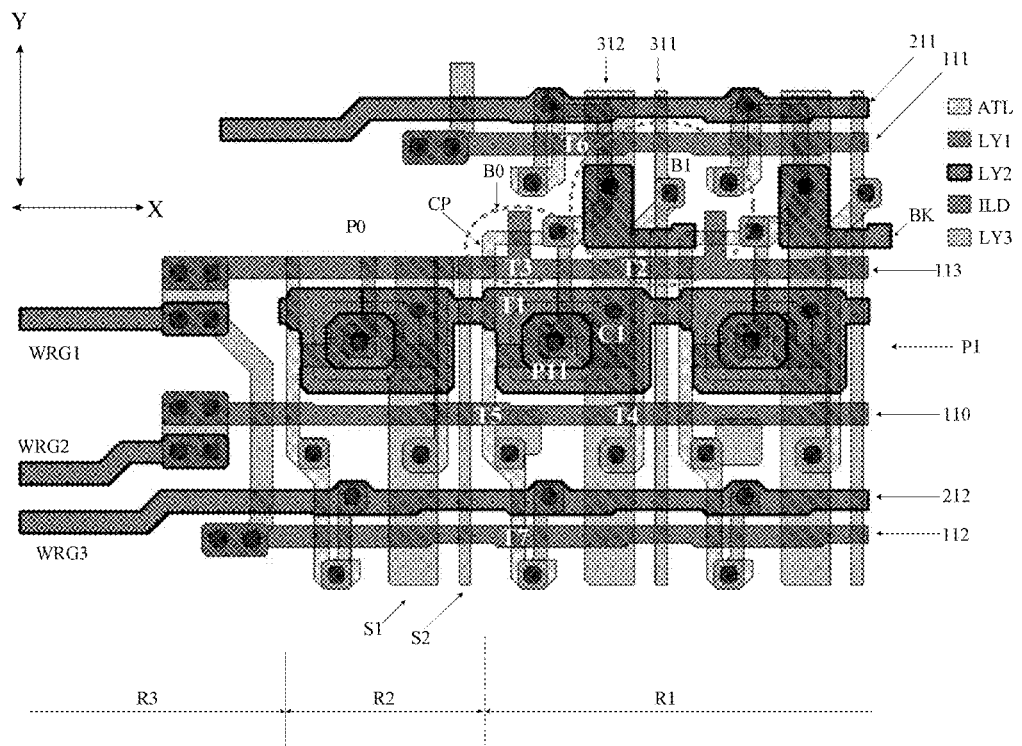
FIG. 1 is a schematic plan view of a display panel.

FIG. 1 is a schematic plan view of a display panel. As illustrated in FIG. 1, the display panel includes a display region R1, a dummy pixel region R2, and a lead wire region R3. A lead wire WRG1 providing a signal of a gate driver on array (GOA), a lead wire WRG2 providing a light-emitting control signal, and a lead wire WRG3 providing an initialization signal Vinit extend to the dummy pixel unit P0 of the dummy pixel region R2 through the lead wire region R3, and then enter the display pixel unit P1 of the display region RE For example, the leftmost display pixel unit includes a red (R) sub-pixel or a blue (B) sub-pixel, but is not limited thereto. The display pixel unit includes at least one of a red sub-pixel, a green sub-pixel, and a blue sub-pixel, but is not limited thereto.

As illustrated in FIG. 1, the display panel includes an active layer ALT, a first conductive pattern layer LY1, a second conductive pattern layer LY2, an interlayer insulating layer ILD, and a third conductive pattern layer LY3. For example, the first conductive pattern layer LY1 is a first gate layer, the second conductive pattern layer LY2 is a second gate layer, and the third conductive pattern layer LY3 is a source and drain electrode layer.

As illustrated in FIG. 1, the display panel includes a plurality of display pixel units P1, and the pixel circuit of the display panel illustrated in FIG. 1 has a structure of 7T1C. As illustrated in FIG. 1, each display pixel unit P1 includes a driving transistor T1, a data writing transistor T2, a threshold compensation transistor T3, a first light-emitting control transistor T4, a second light-emitting control transistor T5, a first reset transistor T6, a second reset transistor T7, and a storage capacitor C1. The display panel further includes a gate line 113, a data line 311, a first power line 312, a first reset control signal line 111, a second reset control signal line 112, a first initialization signal line 211, and a second initialization signal line 212. The portion of the active layer ALT covered by the first conductive pattern layer LY1 is a channel, which may be polycrystalline silicon, and the portion of the active layer ALT not covered by the first conductive pattern layer LY1 is a conductive layer, which may be obtained by performing a converting-into-conductor treatment on polycrystalline silicon.

FIG. 1 illustrates a dummy pixel unit P0 located in a dummy region R2. FIG. 1 also illustrates a first signal line S1 and a second signal line S2 located in the dummy region R2. FIG. 1 illustrates a first direction X and a second direction Y.

As illustrated in FIG. 1, the threshold compensation transistor T3 has a duel-gate structure, and the first channel and the second channel are connected by a conductive connection portion CP.

In a typical 7T1C pixel circuit, the conductive connection portion CP between the first channel and the second channel of the threshold compensation transistor T3 is in a floating state when the threshold compensation transistor T3 is turned off, which is easily affected by the voltage on a line surrounding the conductive connection portion CP to cause a voltage jump. The voltage jump of the conductive connection portion CP will affect the leakage current of the threshold compensation transistor T3, thus affecting the light-emitting brightness. Therefore, it is necessary to keep the voltage on the conductive connection portion CP stable. A shielding block BK located in the second conductive pattern layer LY2 is designed to form a capacitor with the conductive connection portion CP, and the shielding block BK is connected with the first power line 312 through a via hole in the interlayer insulating layer ILD. Because the signal voltage on the first power line 312 is constant, the voltage on the conductive connection portion CP in the floating state is also stable.

Figure 2:
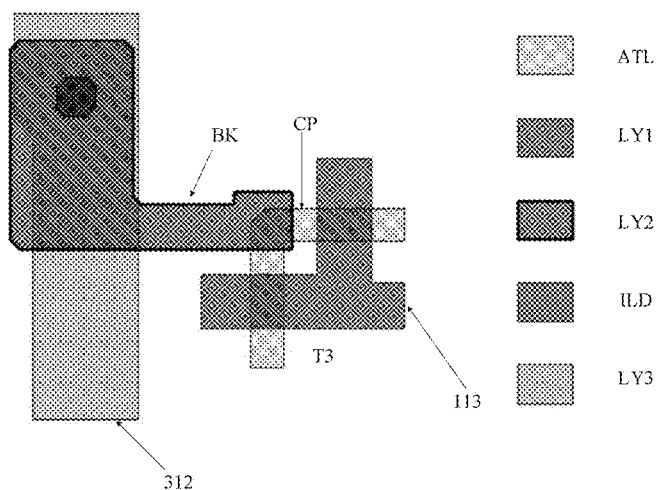
FIG. 2 is a schematic diagram of a part of the structure in the dotted-line circle B1 in FIG. 1.

FIG. 2 is a schematic diagram of a part of the structure in the dotted-line circle B1 in FIG. 1. As illustrated in FIG. 1 and FIG. 2, the shielding block BK is connected with the first power line 312, and the conductive connection portion CP of the threshold compensation transistor T3 and the shielding block BK constitute a capacitor.

Because the above designs all adopt a structure of a capacitor formed by the shielding block connected with the first power line 312 of the pixel circuit of the left display pixel unit and the conductive connection portion CP of the pixel circuit of the right display pixel unit. For example, the shielding block connected with the first power line 312 of the left red pixel unit forms a capacitor with the conductive connection portion CP of the right green pixel unit, and as a result, the conductive connection portion CP of the leftmost pixel unit cannot form the above capacitor structure, as illustrated in the structure within the dotted-line circle B0 in FIG. 1. There is no shielding block to form a capacitor with the conductive connection portion CP of the display pixel unit closest to the edge of the display panel.

According to the display panel provided by the embodiments of the present disclosure, by providing the first shielding block in the dummy pixel unit and connecting the first shielding block with the first signal line, the first signal line can be configured to supply a constant voltage, so that the first shielding block and the conductive connection portion CP closest to the edge of the display panel form a capacitor structure, stabilize the voltage of the first transistor (threshold compensation transistor T3) of the display pixel unit located at the outermost edge, and avoid affecting the leakage current of the first transistor (threshold compensation transistor T3) of the display pixel unit located at the outermost edge.

In the embodiments of the present disclosure, the first transistor is taken as the threshold compensation transistor T3, by way of example, but it is not limited thereto.

Figure 3:
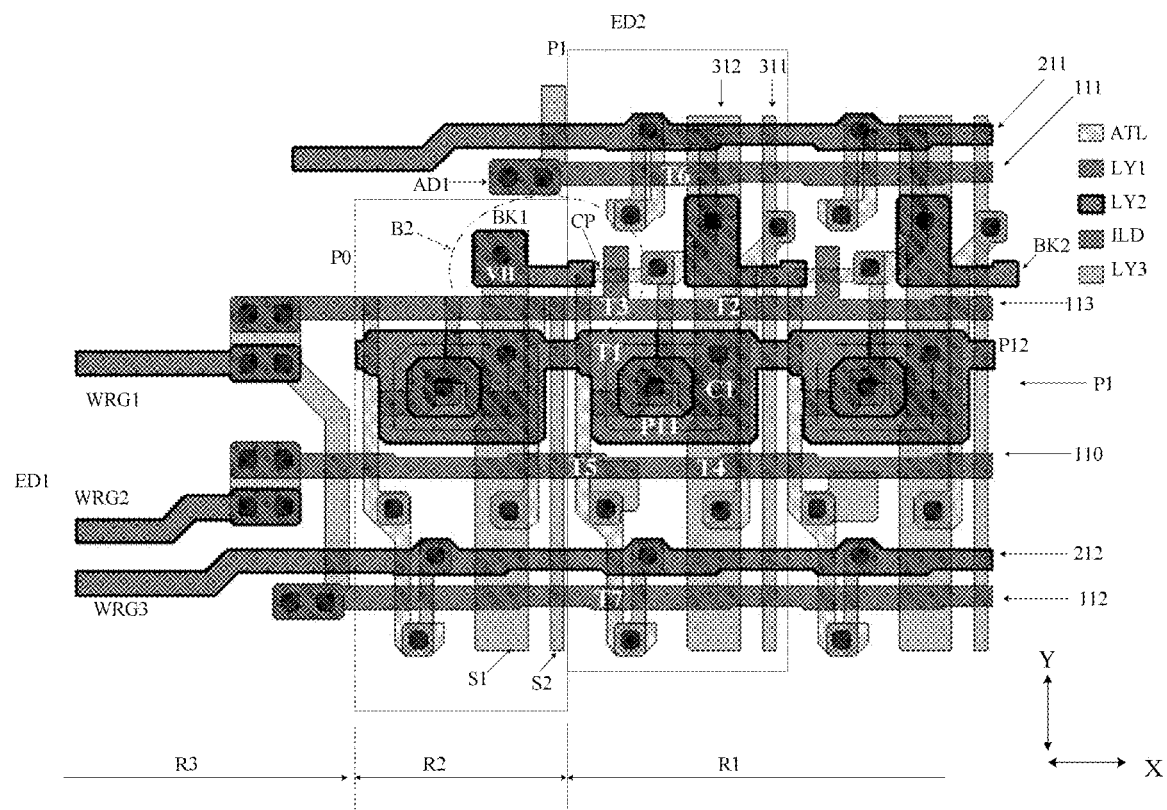
FIG. 3 is a schematic plan view of a display panel provided by an embodiment of the present disclosure.

FIG. 3 is a schematic plan view of a display panel provided by an embodiment of the present disclosure. As illustrated in FIG. 3, the display panel includes a display region R1, a dummy pixel region R2, and a lead wire region R3.

As illustrated in FIG. 3, the display panel includes a display pixel unit P1 and a dummy pixel unit P0. The display pixel unit P1 is located in the display region R1, and the display pixel unit P1 includes a threshold compensation transistor T3, the threshold compensation transistor T3 includes a first channel CN1 and a second channel CN2, the first channel CN1 and the second channel CN2 are connected by a conductive connection portion CP. The dummy pixel unit P0 is located in the dummy region R2, the dummy region R2 is at a side of the display region R1 and is a non-light-emitting region.

As illustrated in FIG. 3, the display panel further includes a first signal line S1 and a first conductive block BK1. The first signal line S1 is located in the dummy region R2. The first conductive block BK1 is connected with the first signal line S1, the first signal line S1 is configured to supply a constant voltage. The display pixel unit P1 includes a first display pixel unit P11. The first display pixel unit P11 is a display pixel unit P1 adjacent to the dummy pixel unit P0 in a row direction. That is, there is no other display pixel unit between the first display pixel unit P11 and the dummy pixel unit P0. For example, the first display pixel unit P11 is the display pixel unit P1 closest to the dummy pixel unit P0. In a plan view (for example, a top view) of the display panel, the first conductive block BK1 partially overlaps with the conductive connection portion CP of the threshold compensation transistor T3 of the first display pixel unit P11 so that the first conductive block BK1 and the conductive connection portion CP constitute two electrode plates of a capacitor. FIG. 3 also illustrates a second signal line S2 located in the dummy region R2. The second signal line S2 may be a dummy data line. The first display pixel unit P11 is adjacent to the dummy pixel unit P0, and no other display pixel unit P1 is arranged between the first display pixel unit P11 and the dummy pixel unit P0. For example, the second signal line S2 can also be input with the data signal, in this case, the dummy pixel unit P0 is not provided with an anode, so that the dummy pixel unit P0 does not emit light.

In FIG. 3, the display pixel unit P1 and the dummy pixel unit P0 are illustrated with rectangular dotted-line boxes, respectively. It should be noted that the region illustrated in FIG. 3 is divided according to the region of the pixel circuit structure of the display pixel unit P1 and the region of the dummy pixel circuit structure of the dummy pixel unit P0, and the embodiment of the present disclosure takes this case as an example. The light-emitting unit of the display pixel unit P1 is not necessarily located within the dotted-line box in the figure. In the display panel provided by the embodiment of the present disclosure, the first conductive block BK1 is provided for the first display pixel unit P11 located at the outermost edge, and is connected with the first signal line Si and configured to supply a constant voltage, thereby stabilizing the voltage on the conductive connection portion CP of the display pixel unit (first display pixel unit P11) located at the outermost edge, stabilizing the voltage of the threshold compensation transistor T3 of the display pixel unit located at the outermost edge, and avoiding affecting the leakage current of the threshold compensation transistor T3 of the display pixel unit located at the outermost edge, and improving the display effect.

For example, as illustrated in FIG. 3, the display panel further includes an interlayer insulating layer ILD (referring to FIG. 26), the interlayer insulating layer ILD is located between the first conductive block BK1 and the first signal line S1, and the first conductive block BK1 and the first signal line S1 are connected through a via hole VH (referring to FIG. 26) penetrating the interlayer insulating layer ILD.

For example, as illustrated in FIG. 3, the display panel includes a plurality of display pixel units P1, the plurality of display units P1 are located in the display region RE As illustrated in FIG. 3, the display panel includes a plurality of dummy pixel units P0, the dummy pixel units P0 are located in the dummy region R2. The lead wire region R3 includes a plurality of lead wires, and each lead wire is connected with the display pixel units P1 of a row through a dummy pixel unit P0 located in the dummy region R2. FIG. 3 illustrates a lead wire WRG1, a lead wire WRG2, and a lead wire WRG3; the lead wire WRG1, the lead wire WRG2 and the lead wire WRG3 can be referred to the previous description, and will not be repeated here.

The pixel circuit of the display panel illustrated in FIG. 3 has a 7T1C structure. As illustrated in FIG. 3, each display pixel unit P1 includes a driving transistor T1, a data writing transistor T2, a threshold compensation transistor T3, a first light-emitting control transistor T4, a second light-emitting control transistor T5, a first reset transistor T6, a second reset transistor T7, and a storage capacitor C1. The display panel further includes a gate line 113, a data line 311, a light-emitting control signal line 110, a first power line 312, a first reset control signal line 111, a second reset control signal line 112, a first initialization signal line 211, and a second initialization signal line 212. The portion of the active layer ALT covered by the first conductive pattern layer LY1 is a channel, which may be polycrystalline silicon, and the portion of the active layer ALT not covered by the first conductive pattern layer LY1 is a conductive layer, which may be obtained by a converting-into-conductor treatment on polycrystalline silicon, and may be heavily doped polycrystalline silicon.

Generally speaking, the pixel circuit of the dummy pixel unit P0 is incomplete, for example, the pixel circuit of the dummy pixel unit P0 does not have at least one of the threshold compensation transistor T3, the first reset transistor T6, and the second reset transistor T7. The dummy pixel unit P0 does not emit light, which is realized by at least one of the following ways: in the first way, the pixel definition layer is not provided with an opening for the dummy pixel unit P0; in the second way, the dummy pixel unit P0 is not provided with an anode; and in the third way, the dummy pixel unit P0 does not have a data signal connecting terminal.

FIG. 3 illustrates a first direction X and a second direction Y. As illustrated in FIG. 3, the data line 311 and the first power line 312 both extend in the second direction Y, and the gate line 113, the light-emitting control signal line 110, the first reset control signal line 111, the second reset control signal line 112, the first initialization signal line 211, and the second initialization signal line 212 all extend in the first direction X.

For example, as illustrated in FIG. 3, the initialization signal lines include a first initialization signal line 211 and a second initialization signal line 212. The first conductive block BK1 is located in the same layer as the first initialization signal line 211 and the second initialization signal line 212, and all of them are located in the second conductive pattern layer LY2.

For example, as illustrated in FIG. 3, the first signal line S1 extends in the second direction Y, and the first conductive block BK1 extends in a direction perpendicular to the extending direction of the first signal line S1. That is, the first conductive block BK1 extends in the first direction X. As illustrated in FIG. 3, the maximum size of the first conductive block BK1 in the first direction X is greater than the maximum size of the first conductive block BK1 in the second direction Y. As illustrated in FIG. 3, the length of the first conductive block BK1 in the first direction X is greater than the width of the first conductive block BK1 in the second direction Y.

For example, the display panel further includes a second conductive block BK2. The first power line 312 is located in the display region R1, in the same layer as the first signal line S1, and both are located in the third conductive pattern layer LY3. The second conductive block BK2 is located in the display region R1, in the same layer as the first conductive block BK1, and both are located in the second conductive pattern layer LY2. The second conductive block BK2 is connected with the first power line 312. The display pixel unit P1 includes a second display pixel unit P12, the second display pixel unit P12 is located at a side of the first display pixel unit P11 away from the dummy pixel unit P0, in a plan view (e.g., a top view) of the display panel, the second conductive block BK2 partially overlaps with the conductive connection portion CP of the threshold compensation transistor T3 of the second display pixel unit P12, and the first signal line Si and the first power line 312 are arranged in the first direction X, the first signal line Si and the first power line 312 both extend in the second direction Y, and the size of the first conductive block BK1 in the second direction Y is less than or equal to the size of the second conductive block BK2 in the second direction Y. For example, the second direction Y intersects with the first direction X. For example, the second direction Y is perpendicular to the first direction X, but is not limited thereto. In some embodiments, as illustrated in FIG. 3, in order to reduce a size of the bezel, the size of the first conductive block BK1 in the second direction Y is less than the size of the second conductive block BK2 in the second direction Y.

For example, as illustrated in FIG. 3, the display panel further includes a conductive adapter AD1, the conductive adapter AD1 is connected with the first reset control signal line 111, and is located in the same layer as the first signal line S1, and the conductive adapter AD1 and the first signal line S1 are located in the third conductive pattern layer LY3. The conductive adapter AD1 is arranged at a side of the display pixel unit and at an upper side of the dummy pixel units that are adjacent to each other, because the conductive adapter AD1 needs to occupy a certain space, in this case, the space for providing the first conductive block in the dummy pixel unit will be limited.

For example, as illustrated in FIG. 3, in the display panel, the second reset control signal line 112 of the display pixel unit of the current row simultaneously serves as the first reset control signal line 111 of the display pixel unit of the next row.

Figure 4:
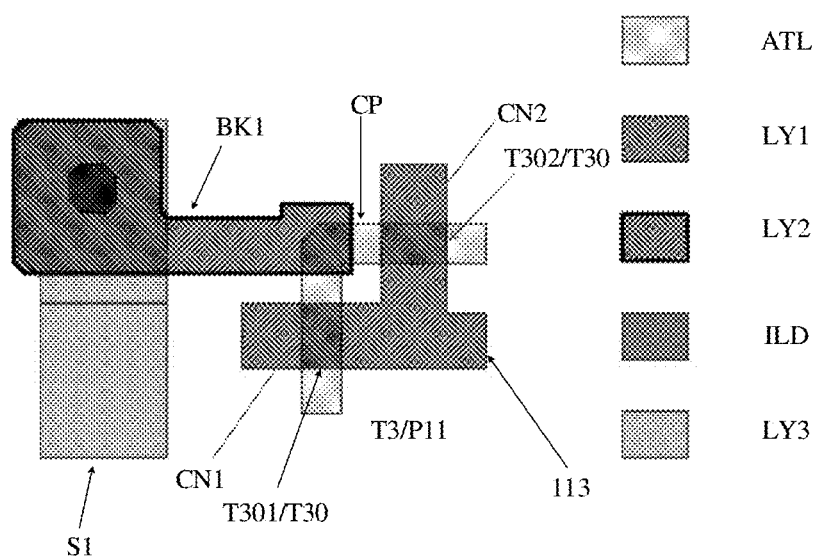
FIG. 4 is a schematic diagram of a part of the structure in the dotted-line circle B2 in FIG. 3.

FIG. 4 is a schematic diagram of a part of the structure in the dotted-line circle B2 in FIG. 3. As illustrated in FIG. 4, the threshold compensation transistor T3 includes a first gate electrode T301 and a second gate electrode T302, the first gate electrode T301 and the second gate electrode T302 constitute a gate electrode T30 of the threshold compensation transistor T3. The first gate electrode T301 and the second gate electrode T302 are connected with the gate line 113, respectively; and the first gate electrode T301 and the second gate electrode T302 overlap with the first channel CN1 and the second channel CN2, respectively, in the direction perpendicular to the display panel. Referring to FIG. 3 and FIG. 4, the first display pixel unit P11 is the display pixel unit P1 closest to the edge ED1 of the display panel, and the first reset control signal line 111 is closer to the edge ED2 of the display panel than the gate line 113. For example, as illustrated in FIG. 3, edge ED1 is the left edge of the display panel, and edge ED2 is the upper edge of the display panel. Referring to FIG. 3 and FIG. 4, the first display pixel unit P11 is the display pixel unit P1 closest to the dummy pixel unit P0 in the first direction X, or the first display pixel unit P11 is the display pixel unit P1 closest to the edge ED1 of the display panel in the first direction X. Referring to FIG. 3 and FIG. 4, in the second direction Y, the first reset control signal line 111 is closer to the edge ED2 of the display panel than the gate line 113. In order to reduce a size of the bezel, the length of the first reset control signal line 111 in the first direction X is less than the length of the gate line 113 in the first direction X. Of course, in other embodiments, the length of the first reset control signal line 111 in the first direction X can also be equal to the length of the gate line 113 in the first direction X.

Figure 5:
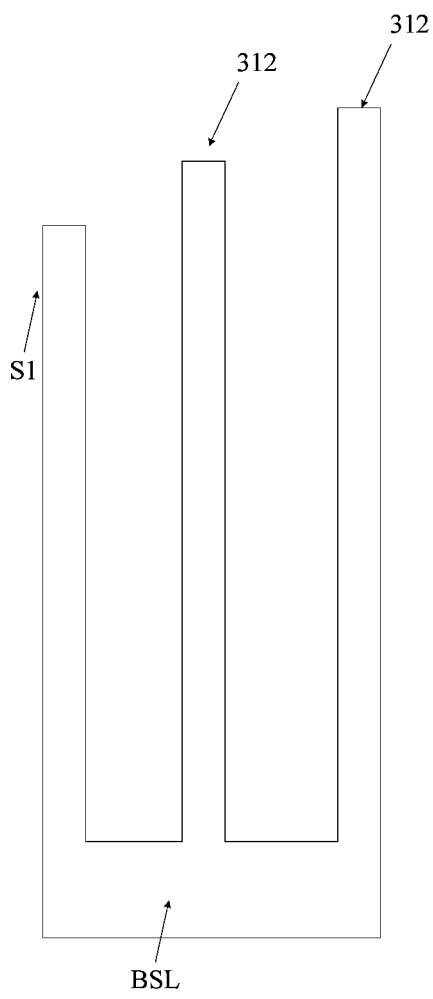
FIG. 5 is a partial structural diagram of a third conductive pattern layer in a display panel provided by an embodiment of the present disclosure.

FIG. 5 is a partial structural diagram of a third conductive pattern layer in a display panel provided by an embodiment of the present disclosure. As illustrated in FIG. 5, the first signal line Si is connected with the first power line 312. As illustrated in FIG. 5, the first signal line S1 and the first power line 312 are connected by a power bus line BSL. The first power line 312 is configured to supply a constant first voltage signal to the display pixel unit P1; therefore, the constant first voltage signal is also on the first signal line S1.

Figure 6:
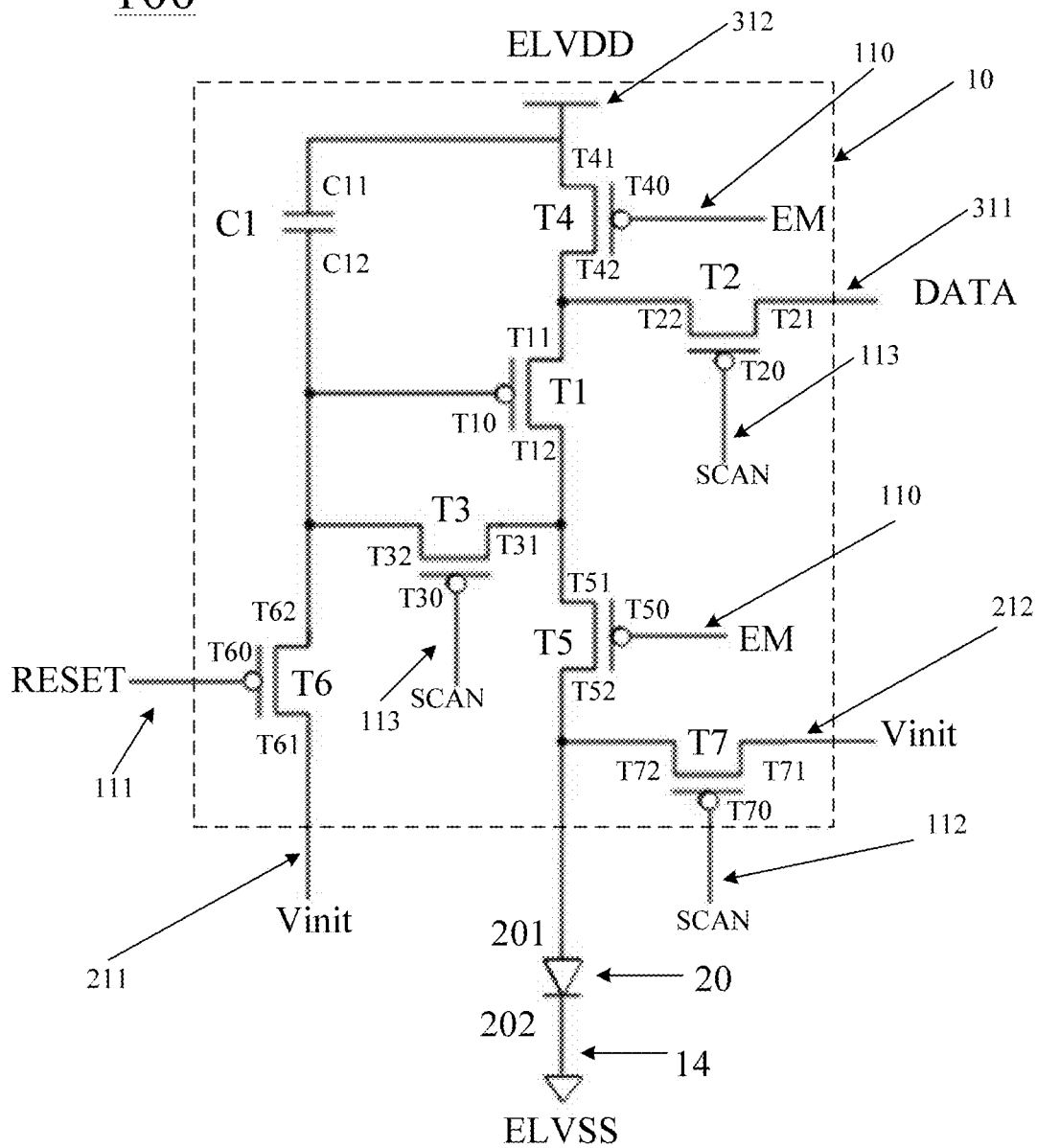
FIG. 6 is a schematic diagram of a pixel circuit structure of a display panel provided by an embodiment of the present disclosure.
Figure 7:
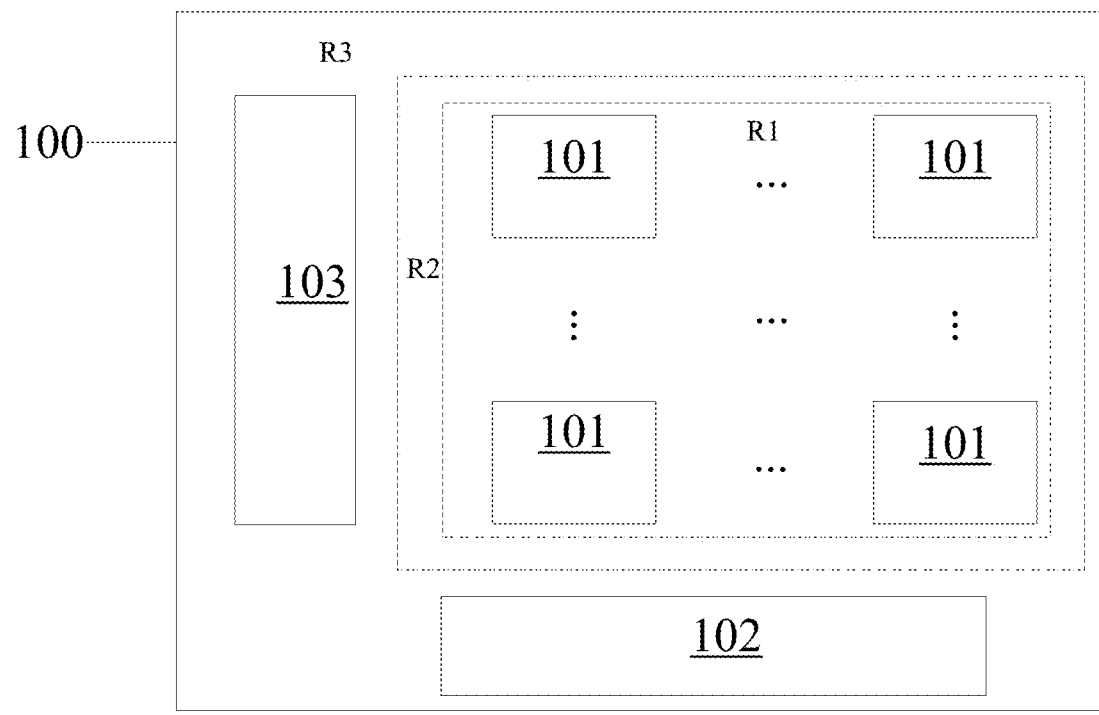
FIG. 7 is a schematic plan view of a display panel provided by an embodiment of the present disclosure.

FIG. 6 is a schematic diagram of a pixel circuit structure of a display panel provided by an embodiment of the present disclosure. FIG. 7 is a schematic plan view of a display panel provided by an embodiment of the present disclosure. Referring to FIG. 6 and FIG. 7, the display panel 100 includes a plurality of pixel units 101 arranged in an array, and each pixel unit 101 includes a pixel circuit structure 10, a light-emitting element 20, a gate line 113, a data line 311, and a voltage signal line. For example, the light-emitting element 20 is an organic light-emitting diode (OLED), and the light-emitting element 20 emits red light, green light, blue light, or white light driven by its corresponding pixel circuit structure 10. The voltage signal line can be one or more. For example, as illustrated in FIG. 6, the voltage signal line includes at least one selected from the group consisting of a first power line 312, a second power line 14, a light-emitting control signal line 110, a first initialization signal line 211, a second initialization signal line 212, a first reset control signal line 111, a second reset control signal line 112, and the like. The gate line 113 is configured to supply a scan signal SCAN to the pixel circuit structure 10. The data line 311 is configured to provide a data signal DATA to the pixel circuit structure 10. For example, a pixel includes a plurality of pixel units. A pixel may include a plurality of pixel units emitting light of different colors. For example, a pixel includes a pixel unit emitting red light, a pixel unit emitting green light and a pixel unit emitting blue light, but is not limited thereto. The number of pixel units included in a pixel and the light-emitting condition of each pixel unit can be determined as required. The pixel unit 101 is the above-mentioned display pixel unit P1. The structure of the dummy pixel unit P0 is formed by omitting a part of the circuit structure of the pixel unit 101 or by omitting a part of the lines of the pixel unit 101. For example, the pixel circuit of the dummy pixel unit P0 is incomplete, the pixel definition layer is not provided with an opening in the dummy region R2, and/or the dummy region R2 does not have an anode. The pixel circuit of the dummy pixel unit P0 being incomplete includes that the pixel circuit of the dummy pixel unit P0 does not have at least one element or component of the pixel circuit structure 10.

For example, the first power line 312 is configured to supply a constant first voltage signal ELVDD to the pixel circuit structure 10, and the second power line 14 is configured to supply a constant second voltage signal ELVSS to the pixel circuit structure 10, and the first voltage signal ELVDD is greater than the second voltage signal ELVSS. The light-emitting control signal line 110 is configured to supply a light-emitting control signal EM to the pixel circuit structure 10. The first initialization signal line 211 and the second initialization signal line 212 are configured to supply an initialization signal Vint to the pixel circuit structure 10, the first reset control signal line 111 is configured to supply a reset control signal RESET to the pixel circuit structure 10, and the second reset control signal line 112 is configured to supply a scan signal SCAN to the pixel circuit structure 10.

The initialization signal Vint is a constant voltage signal, and a magnitude thereof may be between the first voltage signal ELVDD and the second voltage signal ELVSS, but is not limited thereto. For example, the initialization signal Vint may be less than or equal to the second voltage signal ELVSS.

As illustrated in FIG. 6, the pixel circuit structure 10 includes a driving transistor T1, a data writing transistor T2, a threshold compensation transistor T3, a first light-emitting control transistor T4, a second light-emitting control transistor T5, a first reset transistor T6, a second reset transistor T7, and a storage capacitor C1. The driving transistor T1 is electrically connected with the light-emitting element 20, and outputs a driving current to drive the light-emitting element 20 to emit light under the control of a signal such as a scan signal SCAN supplied by the gate line 113, a data signal DATA, a first voltage signal ELVDD, a second voltage signal ELVSS.

In the pixel unit of an organic light-emitting diode display panel, the driving transistor is connected with the organic light-emitting element, and outputs a driving current to the organic light-emitting element under the control of signals such as a data signal and a scan signal, so as to drive the organic light-emitting element to emit light.

For example, as illustrated in FIG. 7, the display panel 100 provided by the embodiment of the present disclosure further includes a data driving circuit 102 and a scan driving circuit 103. The data driving circuit 102 is configured to supply a data signal DATA to the pixel unit 101 according to an instruction of a control circuit; the scan driving circuit 103 is configured to supply a signal such as the light-emitting control signal EM, the scan signal SCAN and the reset control signal RESET to the pixel unit 101 according to the instruction of a control circuit. For example, the control circuit includes an external integrated circuit (IC), but is not limited thereto. For example, the scan driving circuit 103 is of a GOA (gate on array) structure mounted on the display panel, or a driving chip (IC) structure bonded with the display panel. For example, different driving circuits can also be used to supply the light-emitting control signal EM and scan signal SCAN, respectively. For example, the display panel 100 further includes a power supply (not illustrated in the figure) to supply the above voltage signal, the power supply may be a voltage source or a current source as required, and is configured to supply a first voltage signal ELVDD, a second power voltage ELVSS, and an initialization signal Vint to the pixel unit 101 through the first power line 312, the second power line 14, and initialization signal lines (first initialization signal line 211 and second initialization signal line 212), respectively.

For example, as illustrated in FIG. 7, the display substrate includes a display region R1, a dummy pixel region R2, and a lead wire region R3. For example, the dummy pixel region R2 surrounds the display region R1, but is not limited thereto.

As illustrated in FIG. 6, the first electrode C11 of the storage capacitor C1 is electrically connected with the first power line 312, and the second electrode C12 of the storage capacitor C1 is electrically connected with the second electrode T32 of the threshold compensation transistor T3. The gate electrode T20 of the data writing transistor T2 is electrically connected with the gate line 113, and the first electrode T21 and the second electrode T22 of the data writing transistor T2 are electrically connected with the data line 311 and the first electrode T11 of the driving transistor T1, respectively. The gate electrode T30 of threshold compensation transistor T3 is electrically connected with the gate line 113, the first electrode T31 of the threshold compensation transistor T3 is electrically connected with the second electrode T12 of the driving transistor T1, and the second electrode T32 of the threshold compensation transistor T3 is electrically connected with the gate electrode T10 of the driving transistor T1.

For example, as illustrated in FIG. 6, the gate electrode T40 of the first light-emitting control transistor T4 and the gate electrode T50 of the second light-emitting control transistor T5 are both connected with the light-emitting control signal line 110.

For example, as illustrated in FIG. 6, the first electrode T41 and the second electrode T42 of the first light-emitting control transistor T4 are electrically connected with the first power line 312 and the first electrode T11 of the driving transistor T1, respectively. The first electrode T51 and the second electrode T52 of the second light-emitting control transistor T5 are electrically connected with the second electrode T12 of the driving transistor T1 and the first electrode 201 of the light-emitting element 20, respectively. The second electrode 202 of the light-emitting element 20 (which can be a common electrode of the OLED, such as a cathode) is electrically connected with the second power line 14.

For example, as illustrated in FIG. 6, the gate electrode T60 of the first reset transistor T6 is electrically connected with the first reset control signal line 111, the first electrode T61 of the first reset transistor T6 is electrically connected with the first initialization signal line 211, and the second electrode T62 of the first reset transistor T6 is electrically connected with the gate electrode T10 of the driving transistor T1. The gate electrode T70 of the second reset transistor T7 is electrically connected with the second initialization signal line 212, the first electrode T71 of the second reset transistor T7 is electrically connected with the second initialization signal line 212, and the second electrode T72 of the second reset transistor T7 is electrically connected with the first electrode 201 of the light-emitting element 20.

It should be explained that, transistors used in the embodiment of the present disclosure may be thin film transistors, field effect transistors or other switching devices with the same characteristics. A source electrode and a drain electrode of the transistor used herein may be symmetrical in structure, so the source electrode and the drain electrode of the transistor may have no difference in structure. In the embodiments of the present disclosure, in order to distinguish two electrodes of the transistor apart from a gate electrode, one of the two electrodes is directly referred to as a first electrode, and the other of the two electrodes is referred to as a second electrode, and therefore the first electrode and the second electrode of all or part of the transistors in the embodiments of the present disclosure are interchangeable as required. For example, the first electrode of the transistor described in the embodiment of the present disclosure may be the source electrode, and the second electrode may be the drain electrode; alternatively, the first electrode of the transistor may be the drain electrode, and the second electrode may be the source electrode.

In addition, the transistors may be classified into N-type transistors and P-type transistors according to the characteristics of the transistors. The embodiments of the present disclosure illustrate the technical solution of the present disclosure in detail by taking the transistors as P-type transistors as an example. Based on the description and teaching of the implementations of the present disclosure, one of ordinary skill in the art can easily think of an implementation in which at least some of the transistors in the pixel circuit structure of the embodiment of the present disclosure adopt N-type transistors, that is, an implementation of using a transistor of N-type or a combination of a transistor of N-type and a P-type transistor, without any inventive work, therefore, these implementations are also within the scope of the present disclosure.

The pixel circuit of the display substrate illustrated in FIG. 3 may be as illustrated in FIG. 6. The embodiment of the present disclosure is described with reference to the case where the pixel circuit of the display substrate has a structure of 7T1C, by way of example, but is not limited thereto. The pixel circuit of the display substrate may also be a structure including other numbers of transistors, such as 7T2C structure, 6T1C structure, 6T2C structure or 9T2C structure, which is not limited by the embodiments of the present disclosure.

The manufacturing method of the display substrate illustrated in FIG. 3 is given below.

Figure 8:
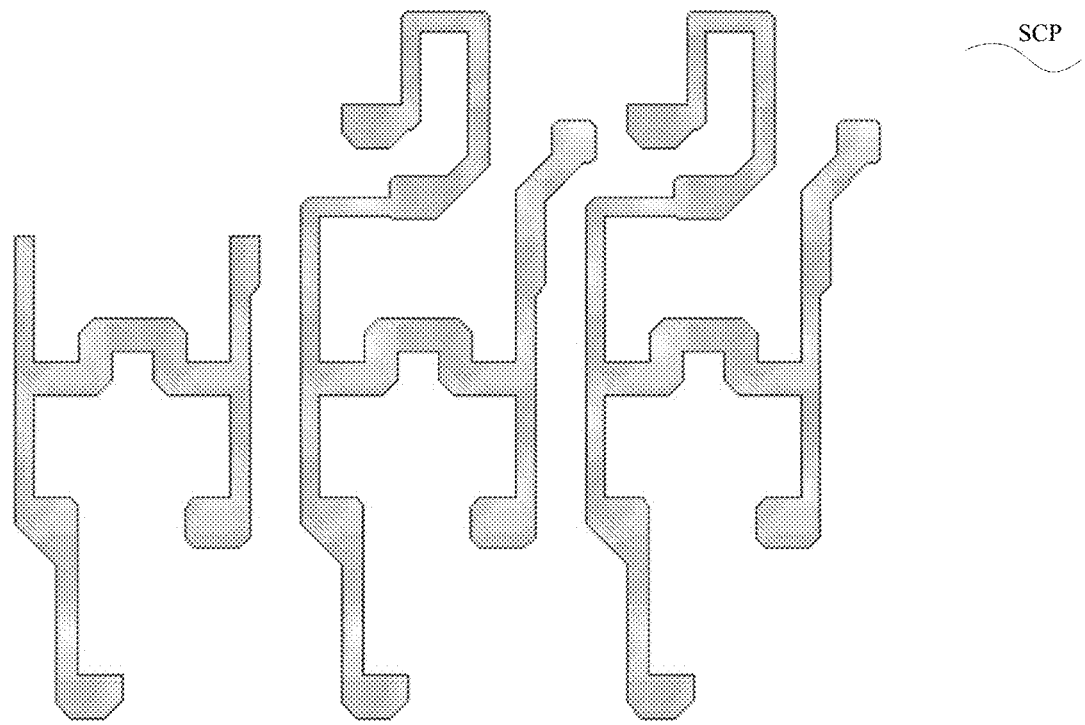
FIG. 8 is a schematic diagram of a semiconductor pattern layer formed in a manufacturing method of a display substrate provided by an embodiment of the present disclosure.

FIG. 8 is a schematic diagram of a semiconductor pattern layer formed in a manufacturing method of a display substrate provided by an embodiment of the present disclosure. The semiconductor pattern layer SCP is formed of a semiconductor material. The semiconductor material includes polycrystalline silicon. A mask plate can be used to form the semiconductor pattern layer SCP. For example, the semiconductor pattern layer SCP can be lightly doped to adjust the threshold voltage of the thin film transistor. Light doping can adopt boron ions for doping.

The manufacturing method of the display substrate provided by one embodiment of the present disclosure further includes forming a first insulating thin film layer on the semiconductor pattern layer SCP. The first insulating thin film layer may be $SiO_x$, but is not limited thereto.

Figure 9:
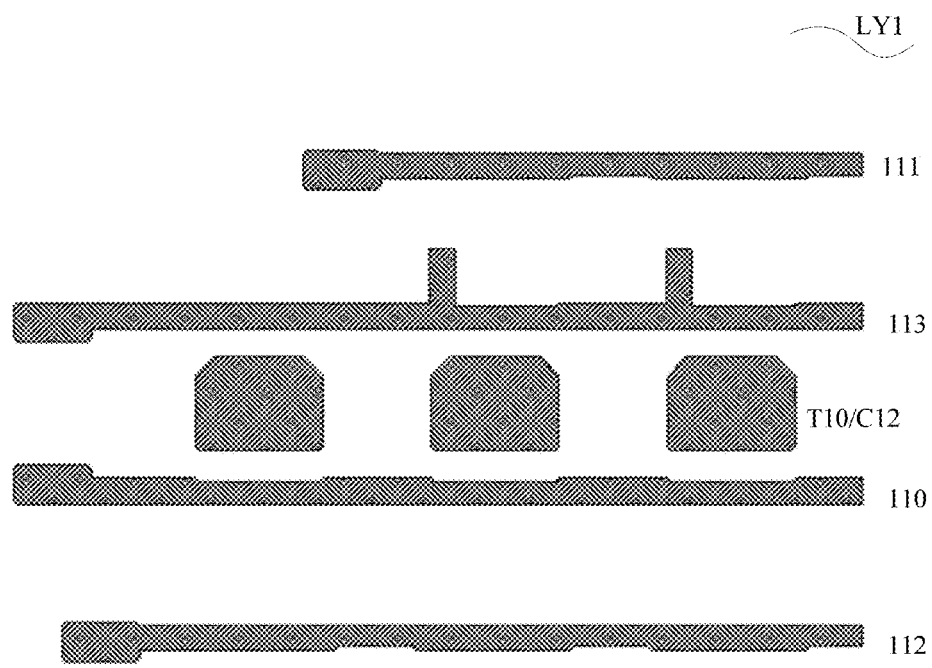
FIG. 9 is a schematic diagram of a first conductive pattern layer formed on a first insulating thin film layer in a manufacturing method of a display substrate provided by an embodiment of the present disclosure.

FIG. 9 is a schematic diagram of a first conductive pattern layer formed on a first insulating thin film layer in a manufacturing method of a display substrate provided by an embodiment of the present disclosure. The first conductive pattern layer LY1 includes a light-emitting control signal line 110, a first reset control signal line 111, a second reset control signal line 112, a gate line 113, and a gate electrode T10 of the driving transistor T1. The gate electrode T10 of the driving transistor T1 also serves as the second electrode C12 of the storage capacitor C1. The material of the first conductive pattern layer LY1 includes metal, and the metal includes molybdenum (Mo), but is not limited thereto.

Figure 10:
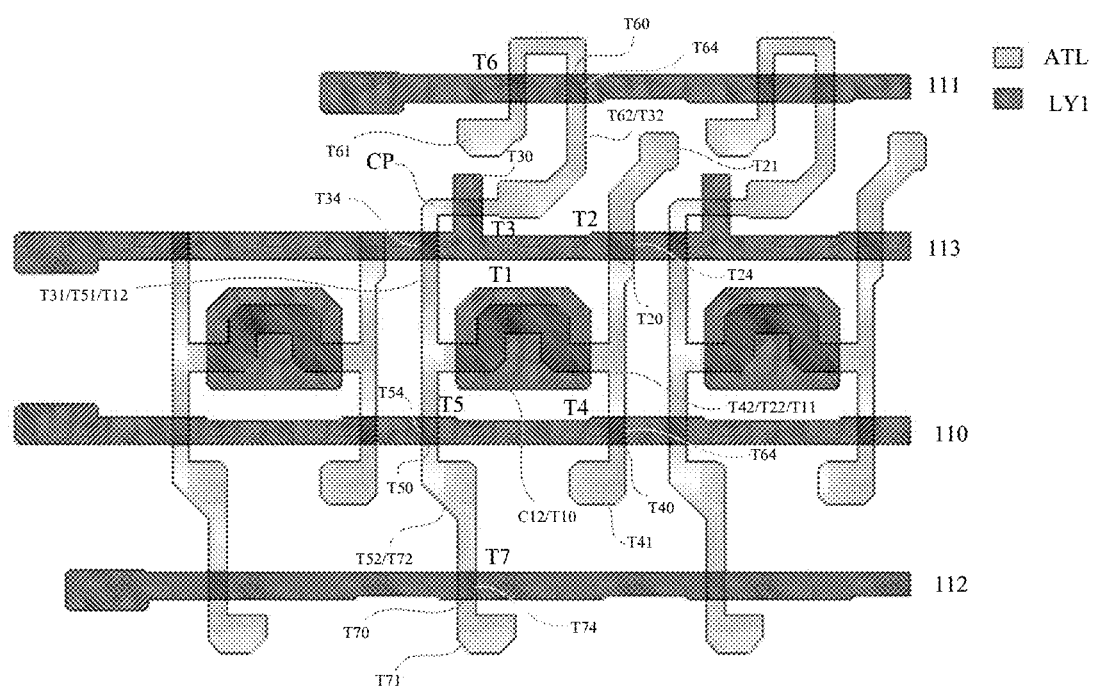
FIG. 10 is a schematic diagram of a structure obtained by performing a converting-into-conductor treatment on a semiconductor pattern layer by adopting a self-aligned process in a manufacturing method of a display substrate provided by an embodiment of the present disclosure.

FIG. 10 is a schematic diagram of a structure obtained by performing a converting-into-conductor treatment on a semiconductor pattern layer by adopting a self-aligned process in a manufacturing method of a display substrate provided by an embodiment of the present disclosure. For example, in the manufacturing process of the display substrate, by adopting the self-aligned process, the semiconductor pattern layer SCP is subjected to a converting-into-conductor treatment by using the first conductive pattern layer LY1 as a mask to form the active layer ATL. For example, the semiconductor pattern layer SCP is heavily doped by ion implantation, for example, a large amount of boron ions can be doped, so that the portion of the semiconductor pattern layer SCP that is not covered by the first conductive pattern layer LY1 has a resistance that is greatly reduced, and has conductive characteristics, that is, is converted into a conductor, to form a source region (first electrode T11) and a drain region (second electrode T12) of a driving transistor T1, a source region (first electrode T21) and a drain region (second electrode T22) of a data writing transistor T2, a source region (first electrode T31) and a drain region (second electrode T32) of a threshold compensation transistor T3, a source region (first electrode T51) and a drain region (second electrode T52) of a second light-emitting control transistor T5, a source region (first electrode T61) and a drain region (second electrode T62) of a first reset transistor T6, and a source region (first electrode T71) and a drain region (second electrode T72) of a second reset transistor T7. The portion of the semiconductor pattern layer SCP covered by the first conductive pattern layer LY1 retains semiconductor characteristics, forming a channel region T14 of the driving transistor T1, a channel region T24 of the data writing transistor T2, a channel region T34 of the threshold compensation transistor T3, a channel region T44 of the first light-emitting control transistor T4, a channel region TM of the second light-emitting control transistor T5, a channel region T64 of the first reset transistor T6, and a channel region T74 of the second reset transistor T7. For example, as illustrated in FIG. 10, the second electrode T72 of the second reset transistor T7 and the second electrode T52 of the second light-emitting control transistor T5 are integrally formed; the first electrode T51 of the second light-emitting control transistor T5, the second electrode T12 of the driving transistor T1, and the first electrode T31 of the threshold compensation transistor T3 are integrally formed; the first electrode T11 of the driving transistor T1, the second electrode T22 of the data writing transistor T2, and the second electrode T42 of the first light-emitting control transistor T4 are integrally formed; the second electrode T32 of the threshold compensation transistor T3 and the second electrode T62 of the first reset transistor T6 are integrally formed.

For example, as illustrated in FIG. 10, the gate electrode T40 of the first light-emitting control transistor T4 is a part of the light-emitting control signal line 110, the gate electrode T50 of the second light-emitting control transistor T5 is a part of the light-emitting control signal line 110, the gate electrode T20 of the data writing transistor T2 is a part of the gate line 113, the gate electrode T30 of the threshold compensation transistor T3 is a part of the gate line 113, the gate electrode T60 of the first reset transistor T6 is a part of the first reset control signal line 111, and the gate electrode T70 of the second reset transistor T7 is a part of the second reset control signal line 112.

For example, the channel region (active layer) of the transistor adopted in the embodiments of the present disclosure may be monocrystalline silicon, polycrystalline silicon (such as low-temperature polycrystalline silicon) or metal oxide semiconductor materials (such as IGZO, AZO, etc.). In an embodiment, the transistors are all p-type low temperature polycrystalline silicon (LTPS) thin film transistors. In another embodiment, the threshold compensation transistor T3 and the first reset transistor T6 directly connected with the gate electrode of the driving transistor T1 are metal oxide semiconductor thin film transistors, that is, the channel materials of the transistors are metal oxide semiconductor materials (such as IGZO, AZO, etc.), and the metal oxide semiconductor thin film transistors have lower leakage current, which can help to reduce the leakage current on the gate electrode of the driving transistor T1.

For example, the transistors adopted in the embodiments of the present disclosure may include various structures, such as top-gate type, bottom-gate type or duel-gate structure. In an embodiment, the threshold compensation transistor T3 and the first reset transistor T6, which are directly connected with the gate electrode of the driving transistor T1, are duel-gate thin film transistors, which can help to reduce the leakage current on the gate electrode of the driving transistor T1.

According to the manufacturing method of the display substrate provided by one embodiment of the present disclosure, a second insulating thin film layer is formed on the structure obtained by performing the converting-into-conductor treatment. The second insulating thin film layer is not illustrated in the figure. For example, the second insulating thin film layer may cover the base substrate in a planar shape. The material of the second insulating thin film layer includes $SiN_x$, but is not limited thereto.

Figure 11:
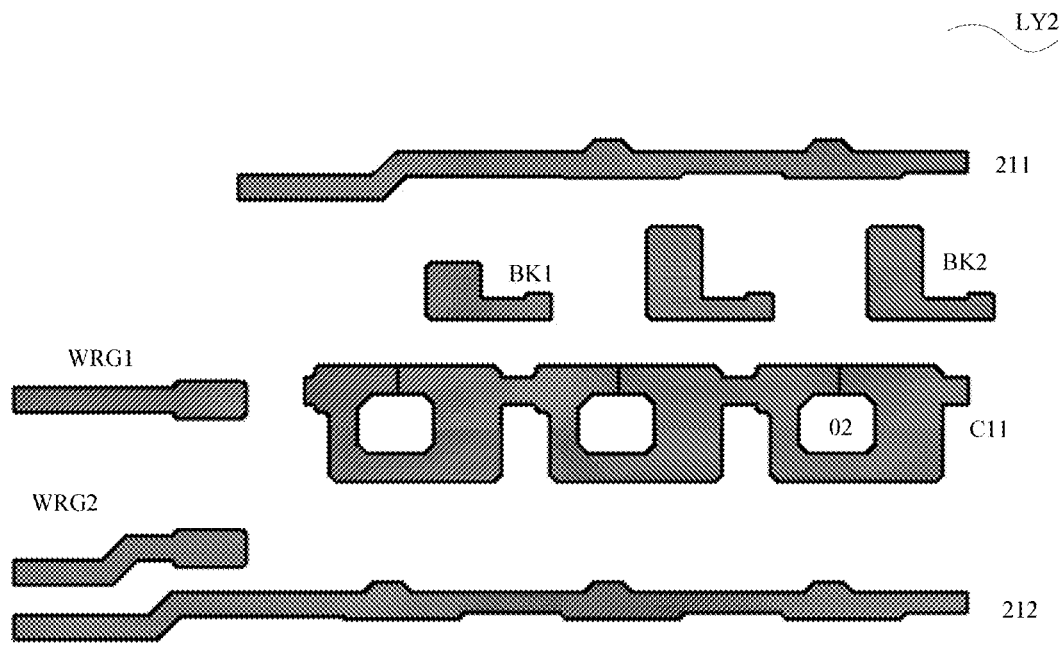
FIG. 11 is a schematic diagram of a second conductive pattern layer formed on a second insulating thin film layer in a manufacturing method of a display substrate provided by an embodiment of the present disclosure.

FIG. 11 is a schematic diagram of a second conductive pattern layer formed on a second insulating thin film layer in a manufacturing method of a display substrate provided by an embodiment of the present disclosure. Second conductive pattern layer LY2 includes a first initialization signal line 211, a first conductive block BK1, a second conductive block BK2, a first electrode C11 of a storage capacitor C1, a second initialization signal line 212, a first lead wire WRG1 and a second lead wire WRG2. The first electrode C11 of the storage capacitor C1 has an opening 02. The first electrode C11 of the storage capacitor C1 has an opening 02, which facilitates the second connection electrode 31b (see FIG. 15) to electrically connect with the second electrode C12 of the storage capacitor C1 passing through the opening 02. The second connection electrode 31b and the first electrode C11 of the storage capacitor C1 are insulated from each other. The material of the second conductive pattern layer LY2 includes metal, and the metal includes molybdenum (Mo), but is not limited thereto.

Figure 12:
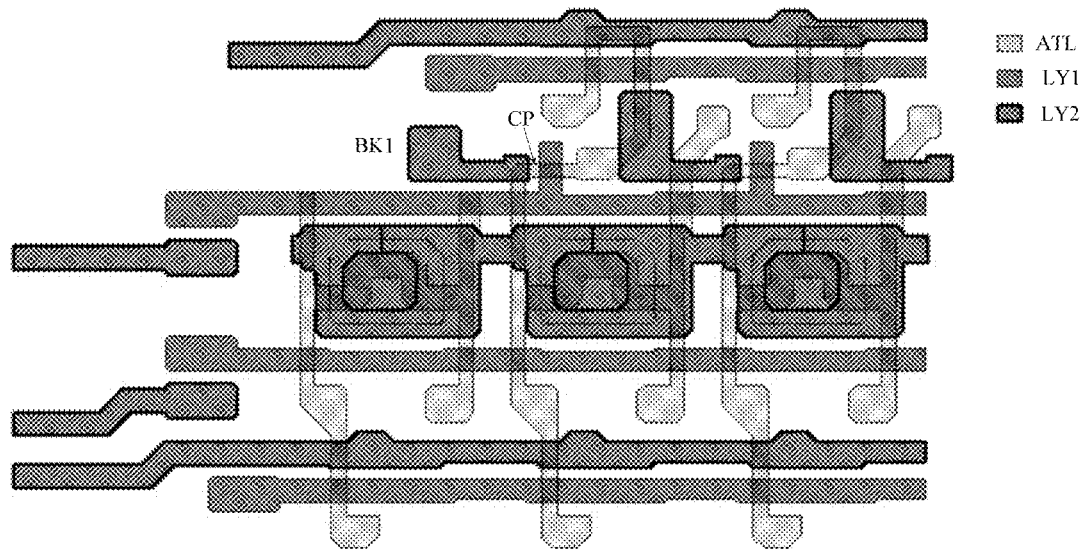
FIG. 12 is a plan view of an active layer, a first conductive pattern layer, and a second conductive pattern layer that are formed in a manufacturing method of a display substrate provided by an embodiment of the present disclosure.

FIG. 12 is a plan view of an active layer, a first conductive pattern layer, and a second conductive pattern layer that are formed in the manufacturing method of a display substrate provided by an embodiment of the present disclosure. As illustrated in FIG. 12, the first conductive block BK1 partially overlaps with the conductive connection portion CP of the threshold compensation transistor T3 of the first display pixel unit to form a capacitor.

Figure 13:
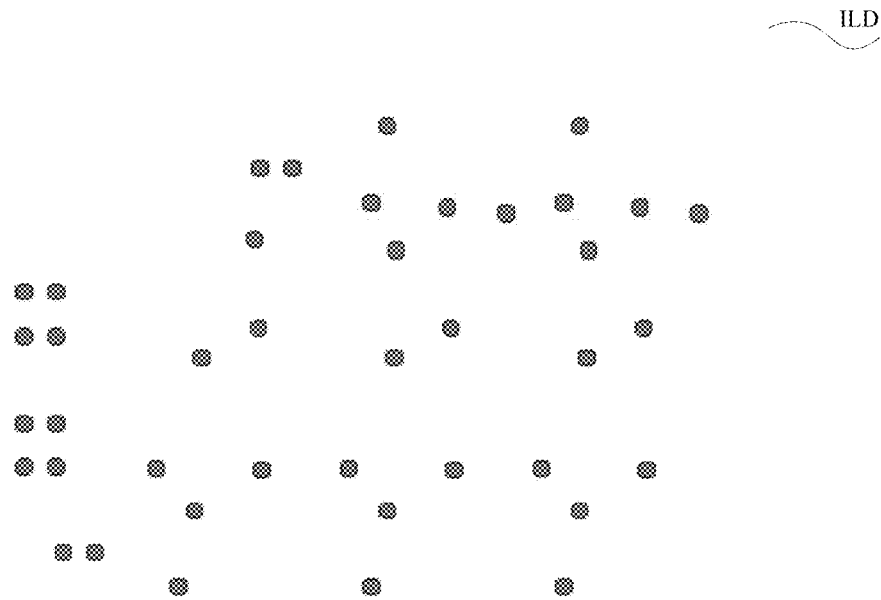
FIG. 13 is a schematic diagram of forming a third insulating thin film layer on the second conductive pattern layer and forming a via hole in at least one of the first insulating thin film layer, the second insulating thin film layer, and the third insulating thin film layer in a manufacturing method of a display substrate provided by an embodiment of the present disclosure.

FIG. 13 is a schematic diagram of forming a third insulating thin film layer on the second conductive pattern layer and forming a via hole in at least one of the first insulating thin film layer, the second insulating thin film layer, and the third insulating thin film layer in the manufacturing method of the display substrate provided by an embodiment of the present disclosure. As illustrated in FIG. 13, after the via hole is formed, a first gate insulating layer, a second gate insulating layer, and an interlayer insulating layer are formed, and the first gate insulating layer, the second gate insulating layer, and the interlayer insulating layer are not illustrated in FIG. 13, which can refer to the following drawings (see FIG. 25). The third insulating thin film layer may cover the base substrate in a planar shape. The first gate insulating layer is a structure after a via hole is formed in the first insulating thin film layer. The second gate insulating layer is a structure after a via hole is formed in the second insulating thin film layer. The interlayer insulating layer is a structure after a via hole is formed in the third insulating thin film layer. The interlayer insulating layer ILD is located between the first conductive block BK1 and the first signal line S1, and the first conductive block BK1 is connected with the first signal line S1 through a via hole VH penetrating the interlayer insulating layer ILD (see FIG. 26). The material of the interlayer insulating layer ILD includes at least one of $SiO_x$, and $SiN_x$, but is not limited thereto.

For example, the gate insulating layer is located between the first conductive block BK1 and the conductive connection portion CP as the dielectric of the capacitor. The gate insulating layer includes a first gate insulating layer GI1 and a second gate insulating layer GI2 (referring to FIG. 26). After the via hole is formed, the first insulating thin film layer and the second insulating thin film layer form the first gate insulating layer GI1 and the second gate insulating layer GI2, respectively.

Figure 14:
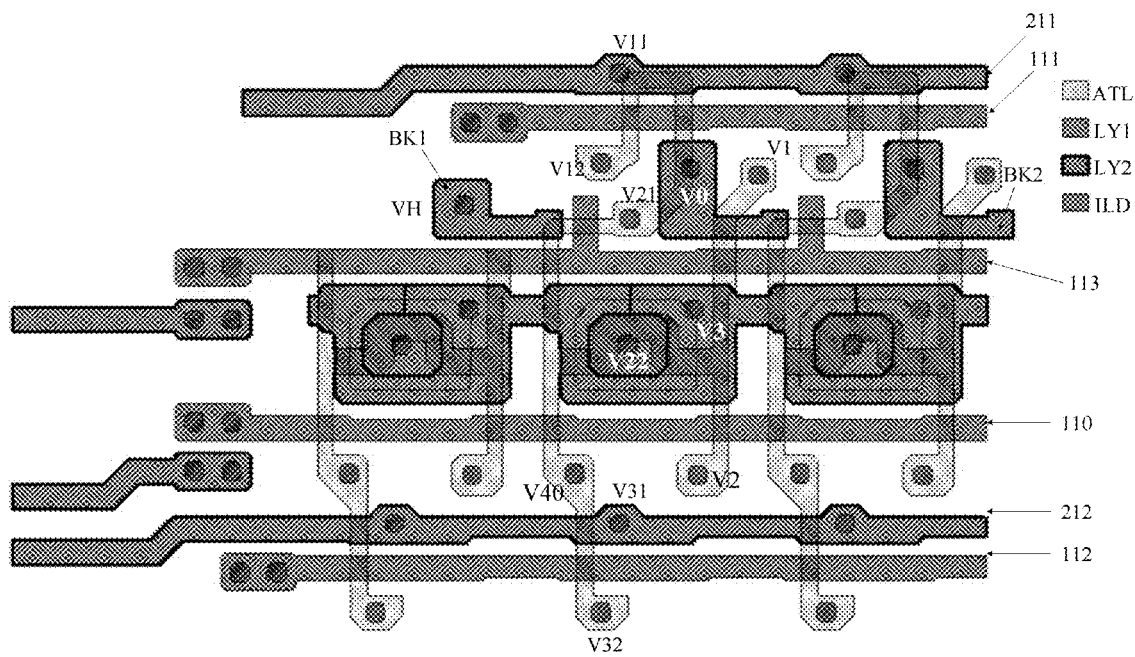
FIG. 14 is a plan view of forming a via hole in a manufacturing method of a display substrate provided by an embodiment of the present disclosure.

FIG. 14 is a plan view of forming a via hole in a manufacturing method of a display substrate provided by an embodiment of the present disclosure. As illustrated in FIG. 14, the interlayer insulating layer includes via holes VH, V40, V0, V1, V2, V3, V11, V12, V21, V22, V31 and V32.

Figure 15:
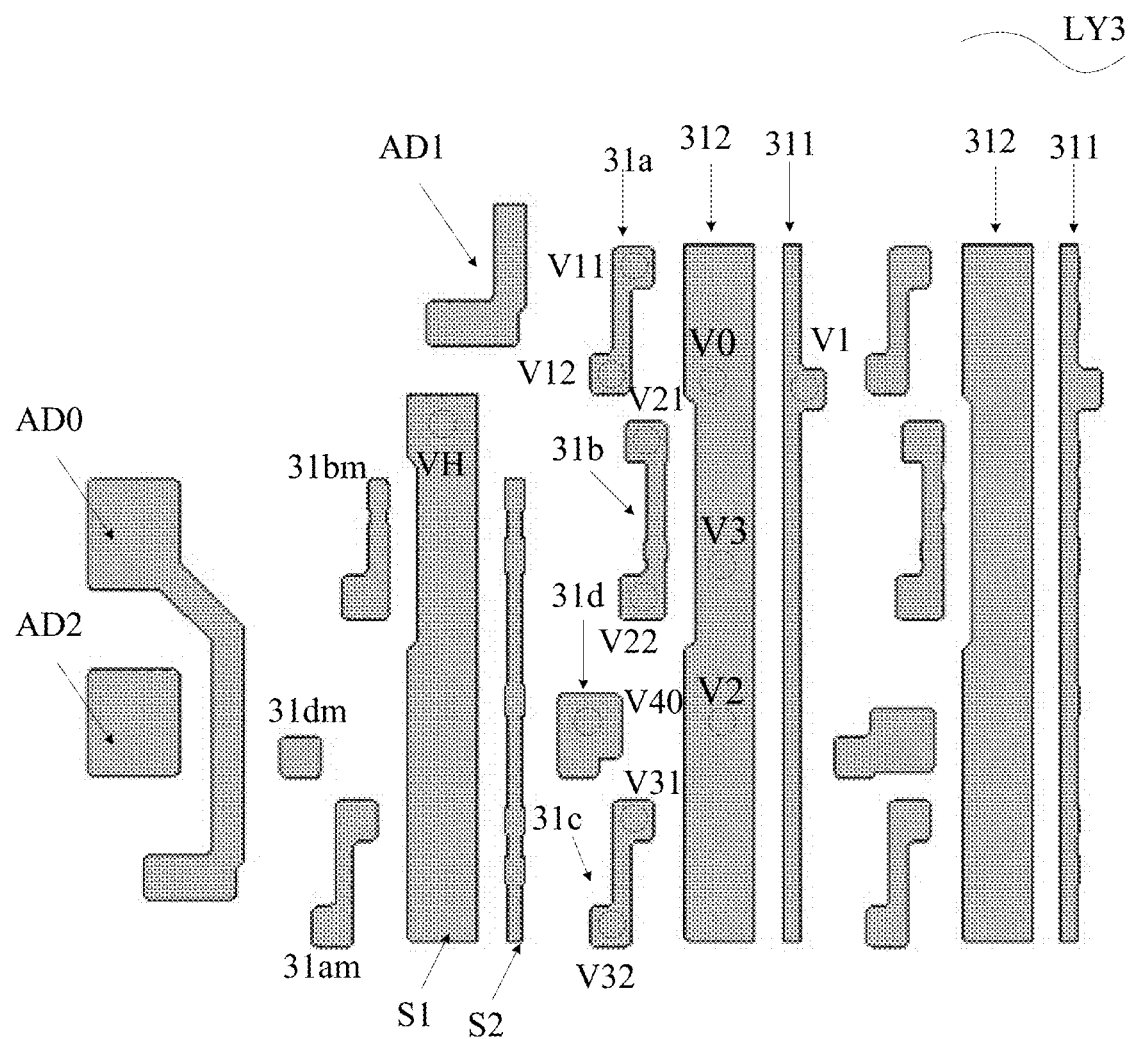
FIG. 15 is a schematic diagram of a third conductive pattern layer formed on an interlayer insulating layer in a manufacturing method of a display substrate provided by an embodiment of the present disclosure.

FIG. 15 is a schematic diagram of a third conductive pattern layer formed on an interlayer insulating layer in a manufacturing method of a display substrate provided by an embodiment of the present disclosure. As illustrated in FIG. 15, the third conductive pattern layer LY3 includes a first connection electrode 31a, a second connection electrode 31b, a third connection electrode 31c, a fourth connection electrode 31d, a data line 311, a first power line 312, conductive adapters AD0, AD1 and AD2, dummy elements 31bm, 31dm and 31am. The dotted-line circles in FIG. 15 refer to the positions of corresponding via holes VH, V40, V0, V1, V2, V3, V11, V12, V21, V22, V31 and V32, respectively. The material of the third conductive pattern layer LY3 includes a metal material, and for example, a structure in which three sub-layers of Ti—Al—Ti are stacked can be adopted, but is not limited thereto.

Figure 16:
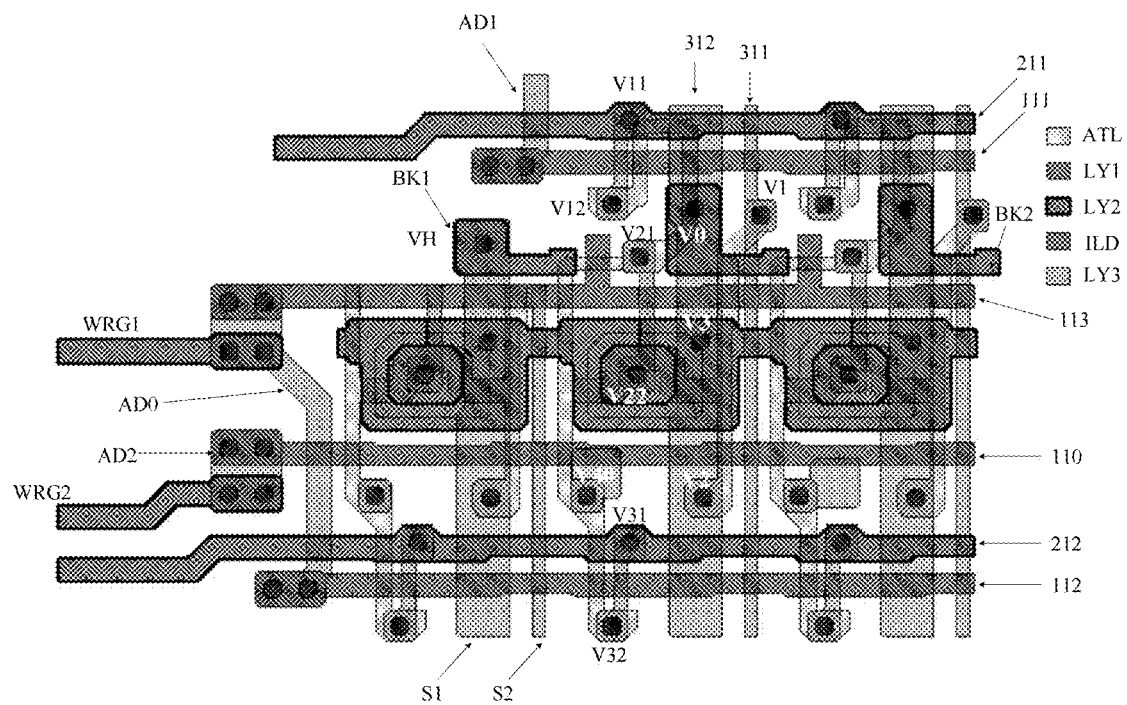
FIG. 16 is a plan view of an active layer, a first conductive pattern layer, a second conductive pattern layer, an interlayer insulating layer, and a third conductive pattern layer formed in a manufacturing method of a display substrate provided by an embodiment of the present disclosure.

FIG. 16 is a plan view of the active layer, the first conductive pattern layer, the second conductive pattern layer, the interlayer insulating layer, and the third conductive pattern layer in the manufacturing method of the display substrate provided by an embodiment of the present disclosure.

For example, as illustrated in FIG. 16, FIG. 15 and FIG. 10, the first connection electrode 31a, the second connection electrode 31b, the third connection electrode 31c, the fourth connection electrode 31d, the data line 311, and the first power line 312 are located in the same layer. Therefore, the data line 311 is electrically connected with the first electrode T21 of the data writing transistor T2 through the via hole V1, the first power line 312 is electrically connected with the first electrode T41 of the first light-emitting control transistor T4 through the via hole V2, the first power line 312 is electrically connected with the first electrode C11 of the storage capacitor C1 through the via hole V3, the first power line 312 is electrically connected with the second conductive block BK2 through the via hole V0, and the first signal line S1 is electrically connected with the first conductive block BK1 through the via hole VH. One end of the first connection electrode 31a is electrically connected with the first initialization signal line 211 through the via hole V11, and the other end of the first connection electrode 31a is electrically connected with the first electrode T61 of the first reset transistor T6 through the via hole V12, so that the first electrode T61 of the first reset transistor T6 is electrically connected with the first initialization signal line 211. One end of the second connection electrode 31b is electrically connected with the second electrode T62 of the first reset transistor T6 through the via hole V21, and the other end of the second connection electrode 31b is electrically connected with the gate electrode T10 of the driving transistor T1 (i.e., the second electrode C12 of the storage capacitor C1) through the via hole V22, so that the second electrode T62 of the first reset transistor T6 is electrically connected with the gate electrode T10 of the driving transistor T1 (i.e., the second electrode C12 of the storage capacitor C1). One end of the third connection electrode 31c is electrically connected with the second initialization signal line 212 through the via hole V31, and the other end of the third connection electrode 31c is electrically connected with the first electrode T71 of the second reset transistor T7 through the via hole V32, so that the first electrode T71 of the second reset transistor T7 is electrically connected with the second initialization signal line 212. The fourth connection electrode 31d is electrically connected with the second electrode T52 of the second light-emitting control transistor T5 through the via hole V40. After forming the third conductive pattern layer, the display substrate illustrated in FIG. 3 can be obtained.

As illustrated in FIG. 16, a lead wire WRG1 and a lead wire WRG2 are located at the side of the dummy pixel unit away from the display pixel unit, the lead wire WRG1 is connected with the gate line 113 and the second reset control signal line 112, respectively, through the conductive adapter AD0; and the lead wire WRG2 is connected with the light-emitting control signal line 110 through the conductive adapter AD2. The conductive adapter AD1 is connected with the first reset control signal line 111. The second initialization signal line 212 extends from the display region to the dummy region and then to the lead wire region.

Referring to FIG. 15 and FIG. 16, the second electrode C12 of the storage capacitor C1 is electrically connected with the second electrode T32 of the threshold compensation transistor T3 through the second connection electrode 31b. The second electrode T32 of the threshold compensation transistor T3 is electrically connected with the gate electrode T10 of the driving transistor T1 through the second connection electrode 31b. The first electrode T61 of the first reset transistor T6 is electrically connected with the first initialization signal line 211 through the first connection electrode 31a. The first electrode T71 of the second reset transistor T7 is electrically connected with the second initialization signal line 212 through the third connection electrode 31c. The fourth connection electrode 31d is electrically connected with the second electrode T52 of the second light-emitting control transistor T5. The fourth connection electrode 31d can be used to electrically connect with the first electrode 201 (referring to FIG. 6) of the light-emitting element 20 formed later.

Figure 17:
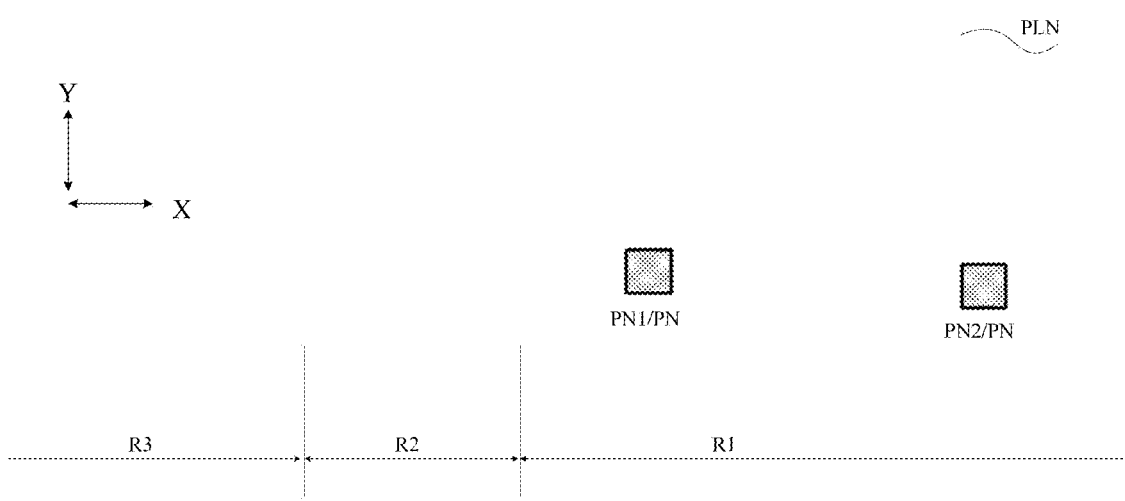
FIG. 17 is a plan view of forming a planarization layer in a manufacturing method of a display substrate provided by an embodiment of the present disclosure.

FIG. 17 is a plan view of forming a planarization layer in a manufacturing method of a display substrate provided by an embodiment of the present disclosure. The planarization layer includes openings PN, the openings PN include openings PN1 and PN2. All the positions of the planarization layer except the openings are made of a planarization material. The planarization layer of the display panel includes a plurality of openings.

Figure 18:
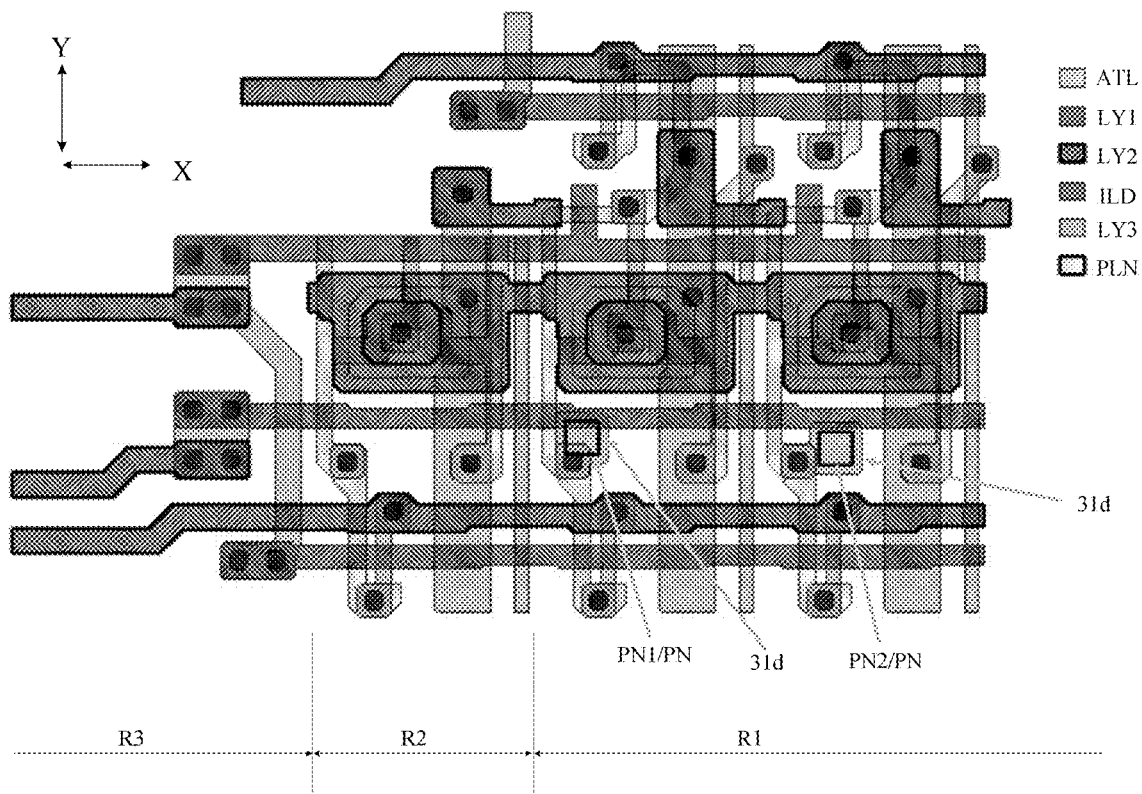
FIG. 18 is a plan view of a structure after a planarization layer is formed in a manufacturing method of a display substrate provided by an embodiment of the present disclosure.

FIG. 18 is a plan view of a structure after the planarization layer is formed in the manufacturing method of the display substrate provided by an embodiment of the present disclosure. The opening PN of the planarization layer is used to expose the fourth connection electrode 31d.

Figure 19:
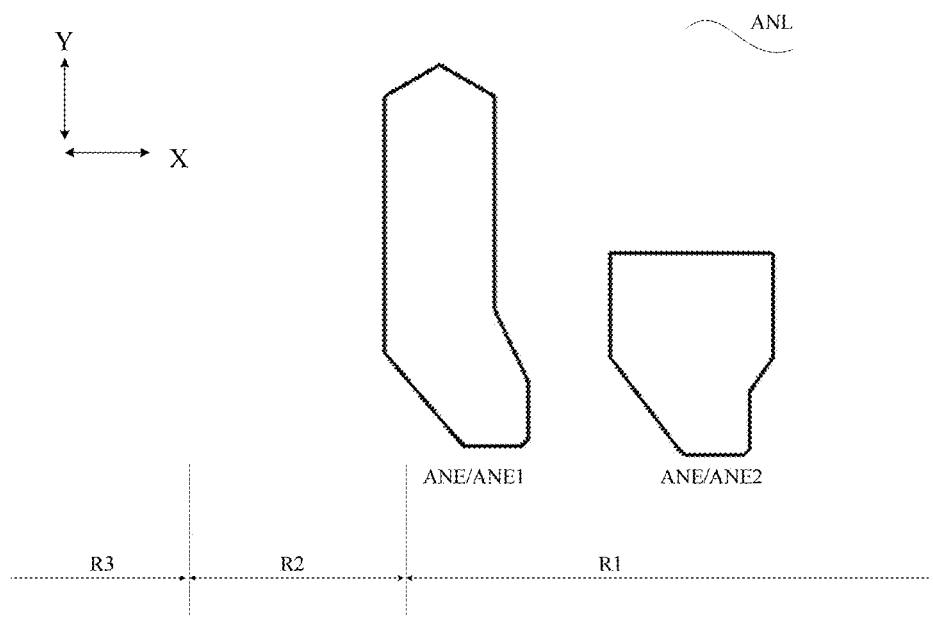
FIG. 19 is a plan view of an anode formed on a planarization layer in a manufacturing method of a display substrate provided by an embodiment of the present disclosure.
Figure 23:
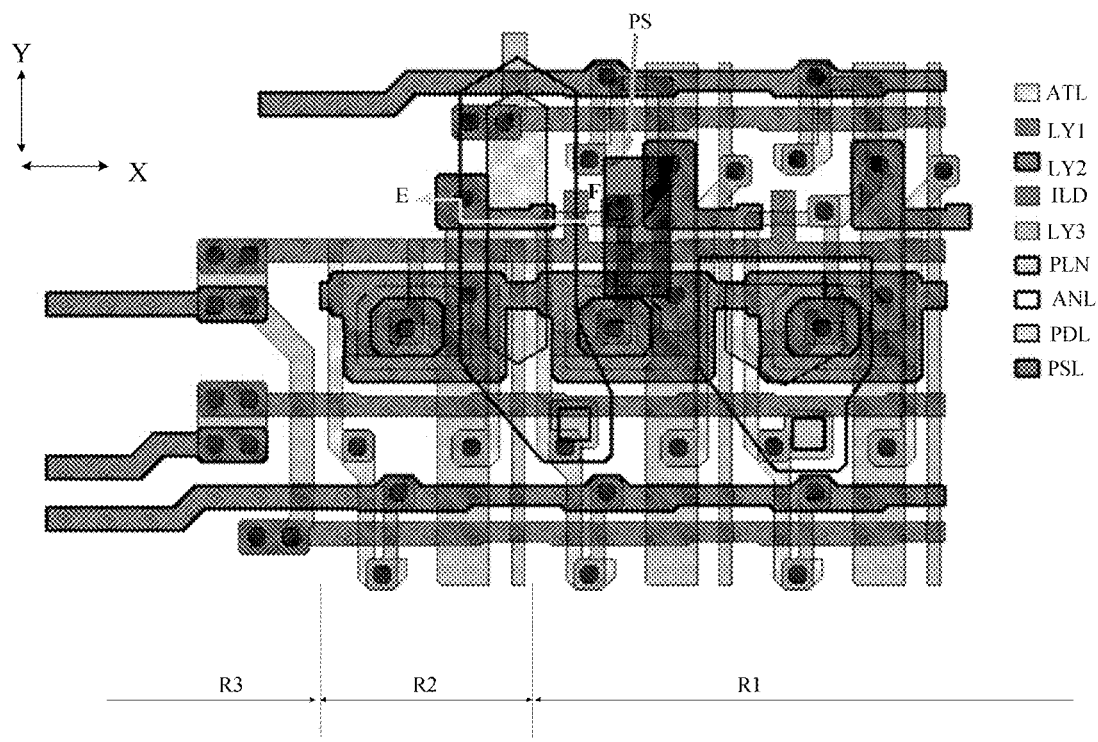
FIG. 23 is a plan view of forming a spacer layer in a manufacturing method of a display substrate provided by an embodiment of the present disclosure.

FIG. 19 is a plan view of forming an anode layer on a planarization layer in a manufacturing method of a display substrate provided by an embodiment of the present disclosure. FIG. 19 illustrates two anodes ANE. The material of anode ANE includes a structure in which three sub layers ITO-Ag-ITO are stacked, but is not limited thereto. The anode layer ANL includes a plurality of anodes ANE. FIG. 19 illustrates a first anode ANE1 and a second anode ANE2. Referring to FIG. 19, FIG. 3 and FIG. 23, the anode ANE is provided for the display pixel unit P1, while the anode layer ANL does not provide any anode ANE for the dummy pixel unit P0 located in the dummy region R2, so that the dummy pixel unit P0 does not emit light. Either the pixel definition layer PDL does not provide an opening for the dummy pixel unit P0 or the anode layer ANL does not provide an anode ANE for the dummy pixel unit P0, so that the dummy pixel unit P0 does not emit light. Of course, it can also be that the pixel definition layer PDL does not provide an opening for the dummy pixel unit P0, and the anode layer ANL does not provide an anode ANE for the dummy pixel unit P0.

Figure 20:
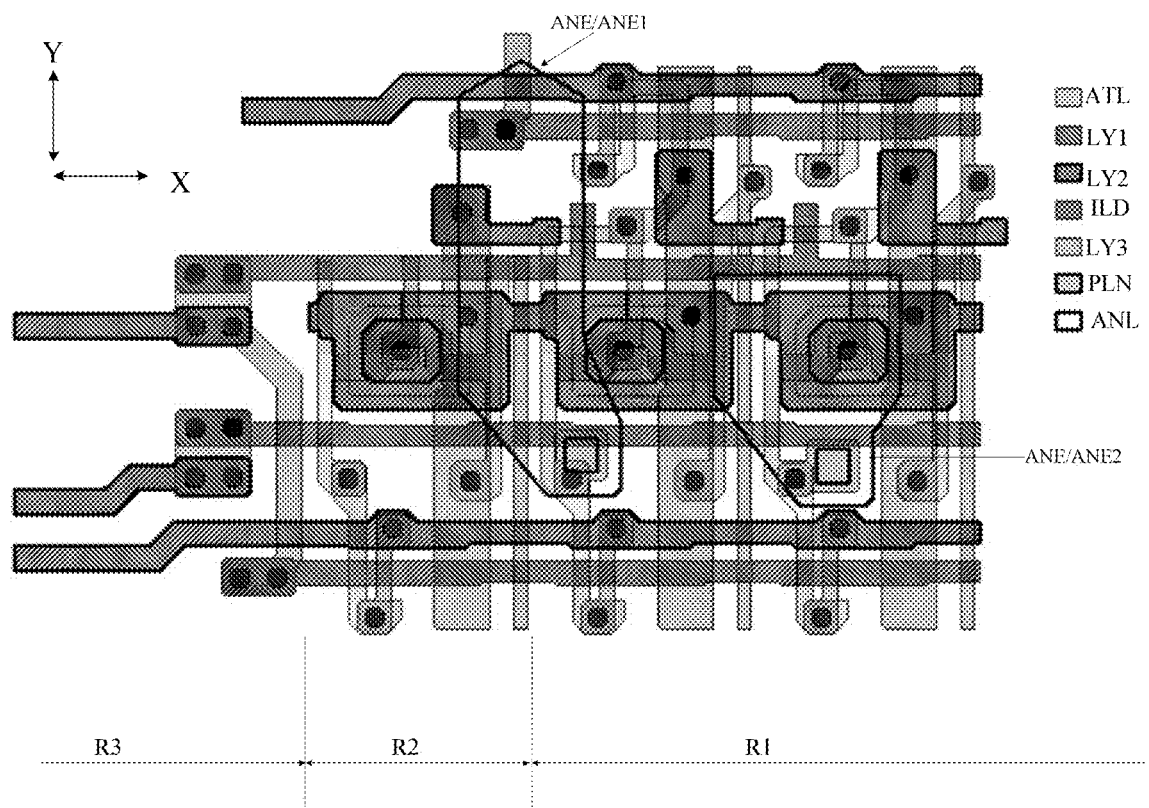
FIG. 20 is a plan view of a display substrate after forming an anode in a manufacturing method of a display substrate provided by an embodiment of the present disclosure.

FIG. 20 is a plan view of the display substrate after forming an anode in the manufacturing method of the display substrate provided by an embodiment of the present disclosure. Referring to FIG. 20 and FIG. 19, the anode ANE is connected with the fourth connection electrode 31d through the opening of the planarization layer, and further connected with the second electrode T52 of the second light-emitting control transistor T5.

Figure 21:
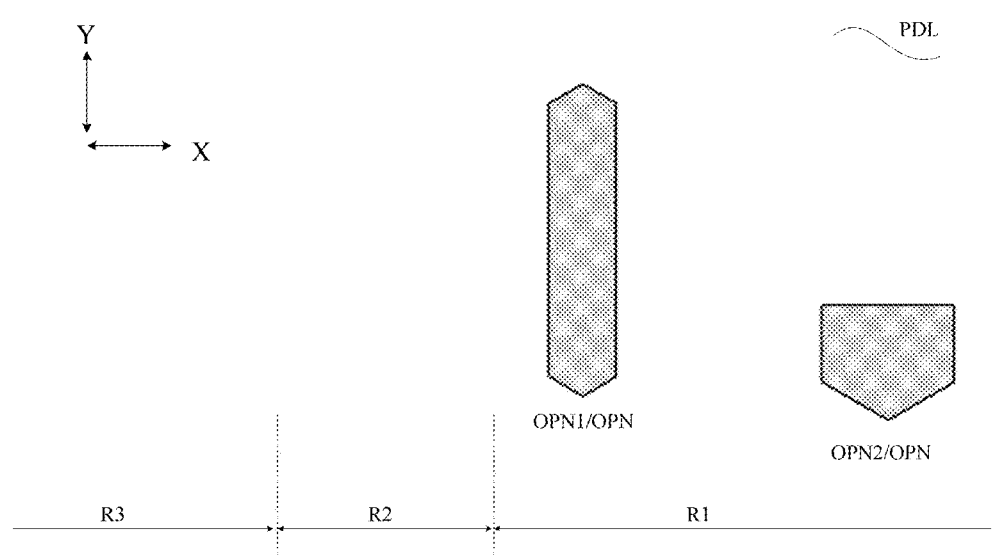
FIG. 21 is a plan view of a pixel definition layer formed in a manufacturing method of a display substrate provided by an embodiment of the present disclosure.

FIG. 21 is a plan view of forming a pixel definition layer in a manufacturing method of a display substrate provided by an embodiment of the present disclosure. The pixel definition layer PDL includes openings OPN, the openings OPN include openings OPN1 and OPN2. The pixel definition layer PDL of the display panel includes a plurality of openings OPN. For example, the pixel definition layer has an opening OPN in the display region R1, which is configured to define the light-emitting region of the display pixel unit P1, and the pixel definition layer does not provide any opening for the dummy pixel unit so that the dummy pixel unit does not emit light.

Figure 22:
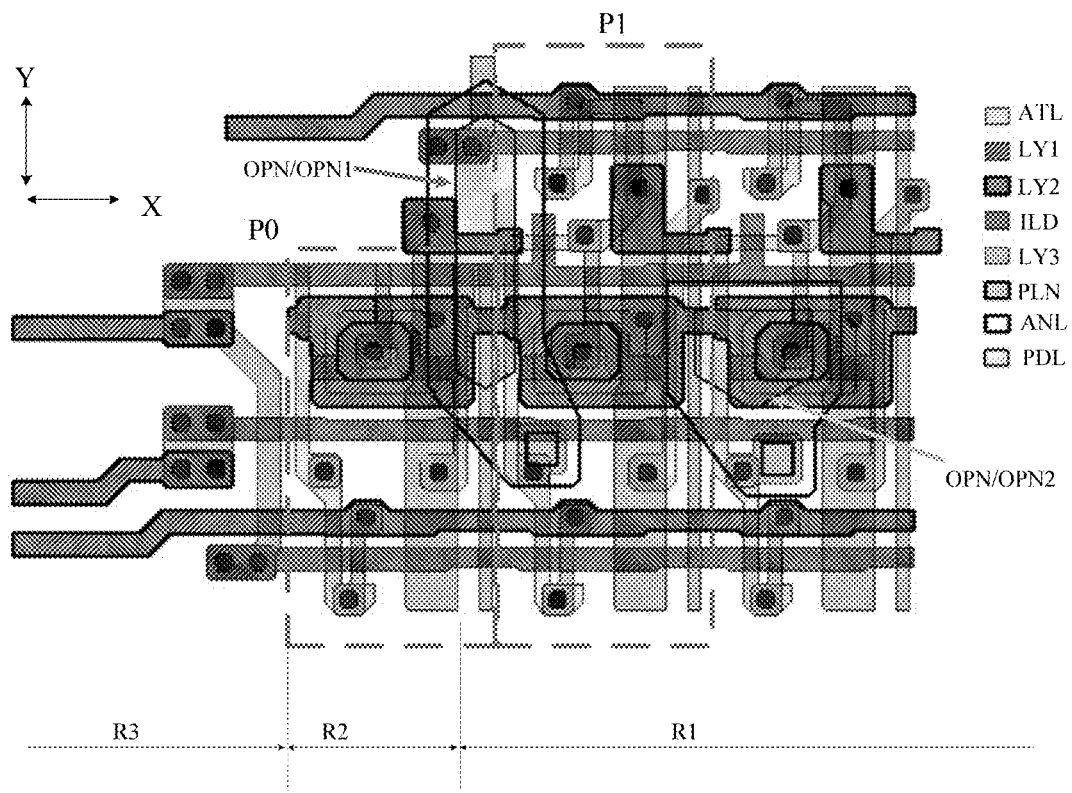
FIG. 22 is a plan view of a display substrate after the pixel definition layer is formed in a manufacturing method of a display substrate provided by an embodiment of the present disclosure.

FIG. 22 is a plan view of the display substrate after the pixel definition layer is formed in the manufacturing method of the display substrate provided by an embodiment of the present disclosure. The opening OPN is used to define the light-emitting area of the light-emitting unit. FIG. 22 illustrates the spatial distribution of display pixel units P1 and dummy pixel units P0, which are represented by dotted-line boxes in FIG. 22, respectively.

FIG. 23 is a plan view of forming a spacer layer in a manufacturing method of a display substrate provided by an embodiment of the present disclosure. As illustrated in FIG. 23, the spacer layer PSL includes a spacer PS. FIG. 23 illustrates one spacer PS. The display substrate includes a plurality of spacers PS. The spacer layer PSL is used to support the fine metal mask plate for forming the light-emitting functional material. In some embodiments, the spacer layer PSL and the pixel definition layer PDL may be formed by the same process using a halftone mask plate.

For example, the manufacturing method of the display panel also includes forming a light-emitting functional layer by vapor deposition process and forming a cathode. For example, the display panel further includes a light-emitting functional layer, which can be located in the dummy region R2. The manufacturing method of the display panel further includes forming an encapsulation layer.

Figure 24:
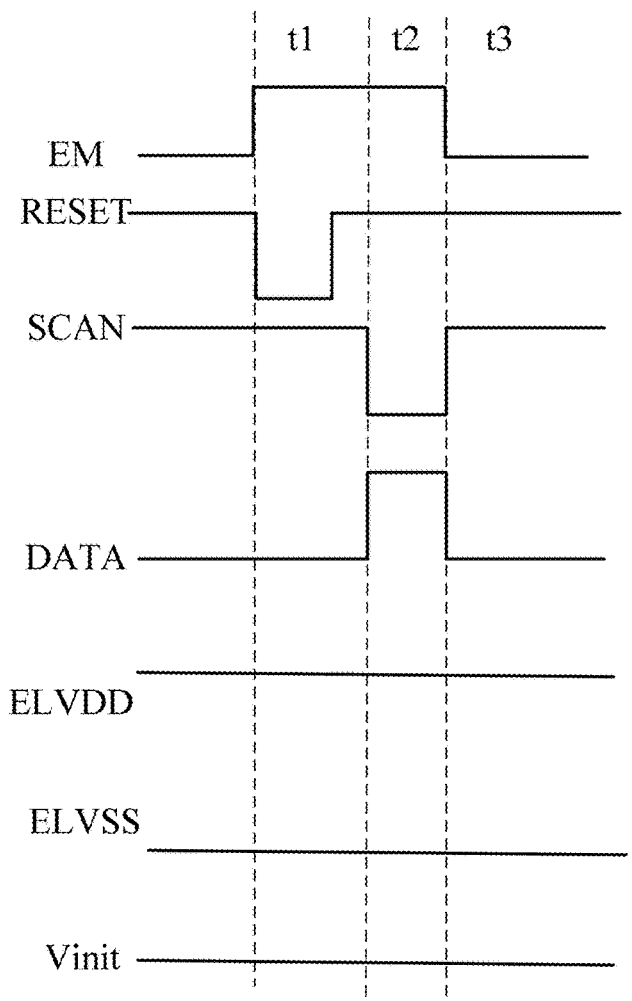
FIG. 24 is a timing signal diagram of a pixel unit in a display panel provided by an embodiment of the present disclosure.

FIG. 24 is a timing signal diagram of a pixel unit in a display panel provided by an embodiment of the present disclosure. Hereinafter, a driving method of one pixel unit in the display panel provided by an embodiment of the present disclosure will be described with reference to FIG. 6 and FIG. 24.

As illustrated in FIG. 24, within a display time period of one frame, the driving method of the pixel unit includes a first reset phase t1, a data writing and threshold compensation and second reset phase t2, and a light-emitting phase t3.

In the first reset phase t1, the light-emitting control signal EM is set to be a turn-off voltage; the reset control signal RESET is set to be a turn-on voltage; and the scan signal SCAN is set to be a turn-off voltage.

In the data writing and threshold compensation and second reset phase t2, the light-emitting control signal EM is set to be a turn-off voltage; the reset control signal RESET is set to be a turn-off voltage; and the scan signal SCAN is set to be a turn-on voltage.

In the light-emitting phase t3, the light-emitting control signal EM is set to be a turn-on voltage; the reset control signal RESET is set to be a turn-off voltage; and the scan signal SCAN is set to be a turn-off voltage.

As illustrated in FIG. 24, the first voltage signal ELVDD, the second voltage signal ELVSS, and the initialization signal Vint are all constant voltage signals; and the initialization signal Vint is between the first voltage signal ELVDD and the second voltage signal ELVSS.

For example, in the embodiment of the present disclosure, the turn-on voltage refers to a voltage that can cause a first electrode and a second electrode of a corresponding transistor to be turned on, and the turn-off voltage refers to a voltage that can cause a first electrode and a second electrode of a corresponding transistor to be turned off. In the case where the transistor is a transistor of p-type, the turn-on voltage is a low voltage (e.g., 0 V), and the turn-off voltage is a high voltage (e.g., 5 V); in the case where the transistor is a transistor of n-type, the turn-on voltage is a high voltage (e.g., 5 V), and the turn-off voltage is a low voltage (e.g., 0 V). Driving waveforms illustrated in FIG. 24 are all described by taking transistors of p-type as an example, that is, the turn-on voltage is a low voltage (e.g., 0 V), and the turn-off voltage is a high voltage (e.g., 5 V).

Referring to FIG. 6 and FIG. 24 together, in the first reset phase t1, the light-emitting control signal EM is a turn-off voltage; the reset control signal RESET is a turn-on voltage; and the scan signal SCAN is a turn-off voltage. In this case, the first reset transistor T6 is in a turn-on state; while the data writing transistor T2, the threshold compensation transistor T3, the first light-emitting control transistor T4, and the second light-emitting control transistor T5 are in a turn-off state. An initialization signal (an initialization voltage) Vint is transmitted to the gate electrode of the driving transistor T1 by the first reset transistor T6 and then is stored by the storage capacitor C1, so as to reset the driving transistor T1 and eliminate the data stored during emitting light in the last time (a previous frame).

In the data writing and threshold compensation and second reset phase t2, the light-emitting control signal EM is a turn-off voltage; the reset control signal RESET is a turn-off voltage; and the scan signal SCAN is a turn-on voltage. In this case, the data writing transistor T2 and the threshold compensation transistor T3 are in a turn-on state; the second reset transistor T7 is in a turn-on state; and the second reset transistor T7 transmits the initialization signal Vint to the first electrode of the light-emitting element 20 to reset the light-emitting element 20; while the first light-emitting control transistor T4, the second light-emitting control transistor T5, the first reset transistor T6, and the second reset transistor T7 are in a turn-off state. At this time, the data writing transistor T2 transmits the data signal voltage VDATA to the first electrode of the driving transistor T1, that is, the data writing transistor T2 receives the scan signal SCAN and the data signal DATA and writes the data signal DATA into the first electrode of the driving transistor T1 according to the scan signal SCAN. The threshold compensation transistor T3 is turned on to connect the driving transistor T1 into a diode structure, so that the gate electrode of the driving transistor T1 can be charged. After the charging is completed, a voltage on the gate electrode of the driving transistor T1 is VDATA+Vth, where, VDATA is a data signal voltage, and Vth is a threshold voltage of the driving transistor T1, that is, the threshold compensation transistor T3 receives the scan signal SCAN and performs threshold voltage compensation on the voltage of the gate electrode of the driving transistor T1. In this phase, a voltage difference between both ends of the storage capacitor C1 is ELVDD−VDATA−Vth.

In the light-emitting phase t3, the light-emitting control signal EM is a turn-on voltage; the reset control signal RESET is a turn-off voltage; and the scan signal SCAN is a turn-off voltage. The first light-emitting control transistor T4 and the second light-emitting control transistor T5 are in a turn-on state; while the data writing transistor T2, the threshold compensation transistor T3, the first reset transistor T6, and the second reset transistor T7 are in a turn-off state. The first power signal ELVDD is transmitted to the first electrode of the driving transistor T1 through the first light-emitting control transistor T4; the voltage on the gate electrode of the driving transistor T1 is maintained at VDATA+Vth; and a light-emitting current I flows into the light-emitting element 20 through the first light-emitting control transistor T4, the driving transistor T1, and the second light-emitting control transistor T5, so that the light-emitting element 20 emits light. That is, the first light-emitting control transistor T4 and the second light-emitting control transistor T5 receive the light-emitting control signal EM, and control the light-emitting element 20 to emit light according to the light-emitting control signal EM. The light-emitting current I satisfies the following saturation current formula:

$$K(Vgs-Vth)^2 = K(VDATA+Vth-ELVDD-Vth)^2 = K(VDATA-ELVDD)^2$$

Where, $$K = 0.5\mu_n Cox \frac{W}{L},$$

$\mu_n$ is channel mobility of the driving transistor, Cox is a channel capacitance per unit area of the driving transistor T1, W and L are a channel width and a channel length of the driving transistor T1, respectively, and Vgs is a voltage difference between the gate electrode and the source electrode (i.e., the first electrode of the driving transistor T1 according to this embodiment) of the driving transistor T1.

It can be seen from the above formula that, the current flowing through the light-emitting element 20 is independent of the threshold voltage of the driving transistor T1. Therefore, the pixel circuit structure is very well compensated for the threshold voltage of the driving transistor T1.

For example, a ratio of duration of the light-emitting phase t3 to a display time period of one frame can be adjusted. In this way, light-emitting brightness can be controlled by adjusting the ratio of the duration of the light-emitting phase t3 to the display time period of one frame. For example, the ratio of the duration of the light-emitting phase t3 to the display time period of one frame is adjusted by controlling the scan driving circuit 103 in the display panel or a driving circuit additionally provided.

For example, in other embodiments, the first reset transistor T6 or the second reset transistor T7, etc. may not be provided, that is, the embodiments of the present disclosure are not limited to the specific pixel circuit illustrated in FIG. 6, and other pixel circuit that can implement compensation to the driving transistor can be used. Based on the description and teaching of the implementations of the present disclosure, other arrangements that can be easily conceived by those skilled in the art without any inventive work are within the protection scope of the present disclosure.

Figure 25:
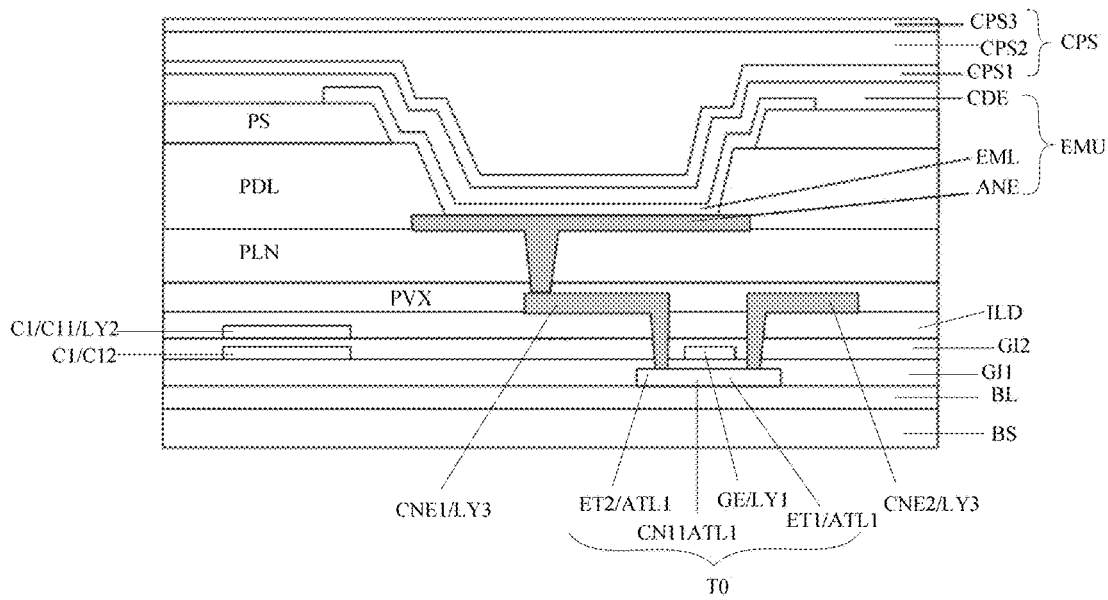
FIG. 25 is a sectional view of a display panel provided by an embodiment of the present disclosure.

FIG. 25 is a sectional view of a display panel provided by an embodiment of the present disclosure. For example, as illustrated in FIG. 25, the display panel includes a thin film transistor T0 and a storage capacitor C1. Thin film transistor T0 is the second light-emitting control transistor T5. Thin film transistor T0 includes an active layer ATL1 on a base substrate BS, a first gate insulating layer GI1 at a side of the active layer ATL1 away from the base substrate BS, and a gate electrode GE at a side of the first gate insulating layer GI1 away from the base substrate BS. The display panel further includes a second gate insulating layer GI2 at a side of the gate electrode GE away from the base substrate BS, an interlayer insulating layer ILD at a side of the second gate insulating layer GI2 away from the base substrate BS, and connection electrodes CNE1 and CNE2 at a side of the interlayer insulating layer ILD away from the base substrate BS. The active layer ATL1 includes a channel CN11 and a first electrode ET1 and a second electrode ET2 located at the two sides of the channel CNI1, the connection electrode CNE1 is connected with the second electrode ET2 through a via hole penetrating the first gate insulating layer GI1, the second gate insulating layer GI2, and the interlayer insulating layer ILD; and the connection electrode CNE2 is connected with the first electrode ET1. The storage capacitor C1 includes a first electrode C12 and a second electrode C11, the first electrode C12 and the gate electrode GE are located in the same layer, and both in the first conductive pattern layer LY1, and the second electrode C11 is located between the second gate insulating layer GI2 and the interlayer insulating layer ILD, and in the second conductive pattern layer LY2. One of the first electrode ET1 and the second electrode ET2 is a source electrode, and the other of the first electrode ET1 and the second electrode ET2 is a drain electrode. The connection electrode CNE1 and the connection electrode CNE2 are located in the third conductive pattern layer LY3. The display panel further includes a passivation layer PVX and a planarization layer PLN. For example, the connection electrode CNE1 and the connection electrode CNE2 can be the fourth connection electrode 31d and the second connection electrode 31b as described above, respectively.

As illustrated in FIG. 25, the display panel further includes a light-emitting unit EMU, the light-emitting unit EMU includes an anode ANE, a light-emitting functional layer EML, and a cathode CDE, and the anode ANE is connected with the connection electrode CNE1 through a via hole penetrating the passivation layer PVX and the planarization layer PLN. The display panel further includes an encapsulation layer CPS, the encapsulation layer CPS includes a first encapsulation layer CPS1, a second encapsulation layer CPS2, and a third encapsulation layer CPS3. For example, the first encapsulation layer CPS1 and the third encapsulation layer CPS3 are inorganic material layers, and the second encapsulation layer CPS2 is an organic material layer.

The light-emitting unit EMU includes an organic light-emitting diode. The light-emitting functional layer is located between the cathode CDE and the anode ANE. The light-emitting functional layer EML at least includes a light-emitting layer, and may also include at least one of a hole transport layer, a hole injection layer, an electron transport layer, and an electron injection layer.

As illustrated in FIG. 25, the display panel further includes a pixel definition layer PDL and a spacer PS. The pixel definition layer PDL has an opening configured to define the light-emitting area (light-emitting region) of the display pixel unit, and the spacer PS is configured to support the fine metal mask plate when forming the light-emitting functional layer EML. FIG. 25 illustrates that spacers PS are provided at opposite sides of the light-emitting unit. For example, spacers PS are provided between adjacent display pixel units, but not limited thereto. In other embodiments, spacers PS are not provided between all of the adjacent display pixel units.

For example, one of the anode and the cathode of the light-emitting unit EMU is electrically connected with a driving transistor, the driving transistor is configured to supply a driving current for driving the light-emitting unit EMU to emit light.

For example, the data line is configured to input a data signal to the display pixel unit, and the first power signal line is configured to supply a first power voltage to the driving transistor. The second power signal line is configured to supply a second power voltage to the display pixel unit. The first power voltage is a constant voltage and the second power voltage is a constant voltage, for example, the first power voltage is a positive voltage and the second power voltage is a negative voltage, but not limited thereto. For example, in some embodiments, the first power voltage is a positive voltage and the second power signal line is grounded.

Figure 26:
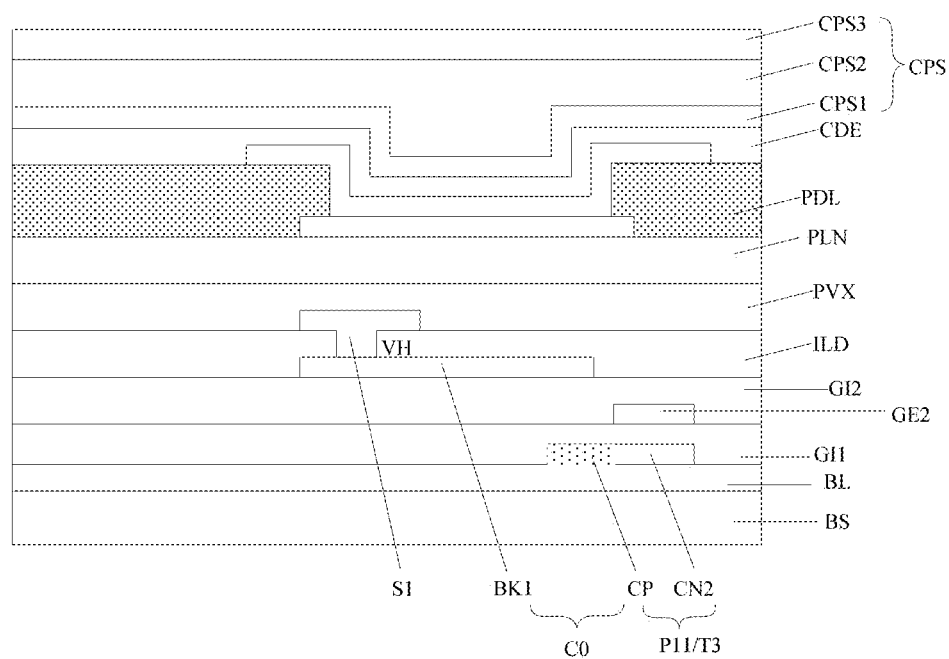
FIG. 26 is a sectional view of a display panel provided by an embodiment of the present disclosure.

FIG. 26 is a sectional view of a display panel provided by an embodiment of the present disclosure. For example, FIG. 26 is a sectional view taken along line E-F of FIG. 23. As illustrated in FIG. 26, the first signal line Si is connected with the first conductive block BK1 through a via hole VH penetrating the interlayer insulating layer. The first conductive block BK1 partially overlaps with the conductive connection portion CP of the threshold compensation transistor T3 of the first display pixel unit P11 to form a capacitor C0, and a first gate insulating layer GI1 and a second gate insulating layer GI2 are arranged between the first conductive block BK1 and the conductive connection portion CP. FIG. 26 also illustrates a second channel CN2. The capacitor C0 can be called a stabilization capacitor, and the first conductive block BK1 and the conductive connection portion CP are two electrode plates of the capacitor C0. As illustrated in FIG. 26, the gate electrode GE2 overlaps with the second channel CN2 in a direction perpendicular to the base substrate BS. The gate electrode GE2 is a gate electrode of the threshold compensation transistor T3.

For example, the first display pixel unit is located at a side edge of the display panel or at a corner of the display panel.

Figure 27:
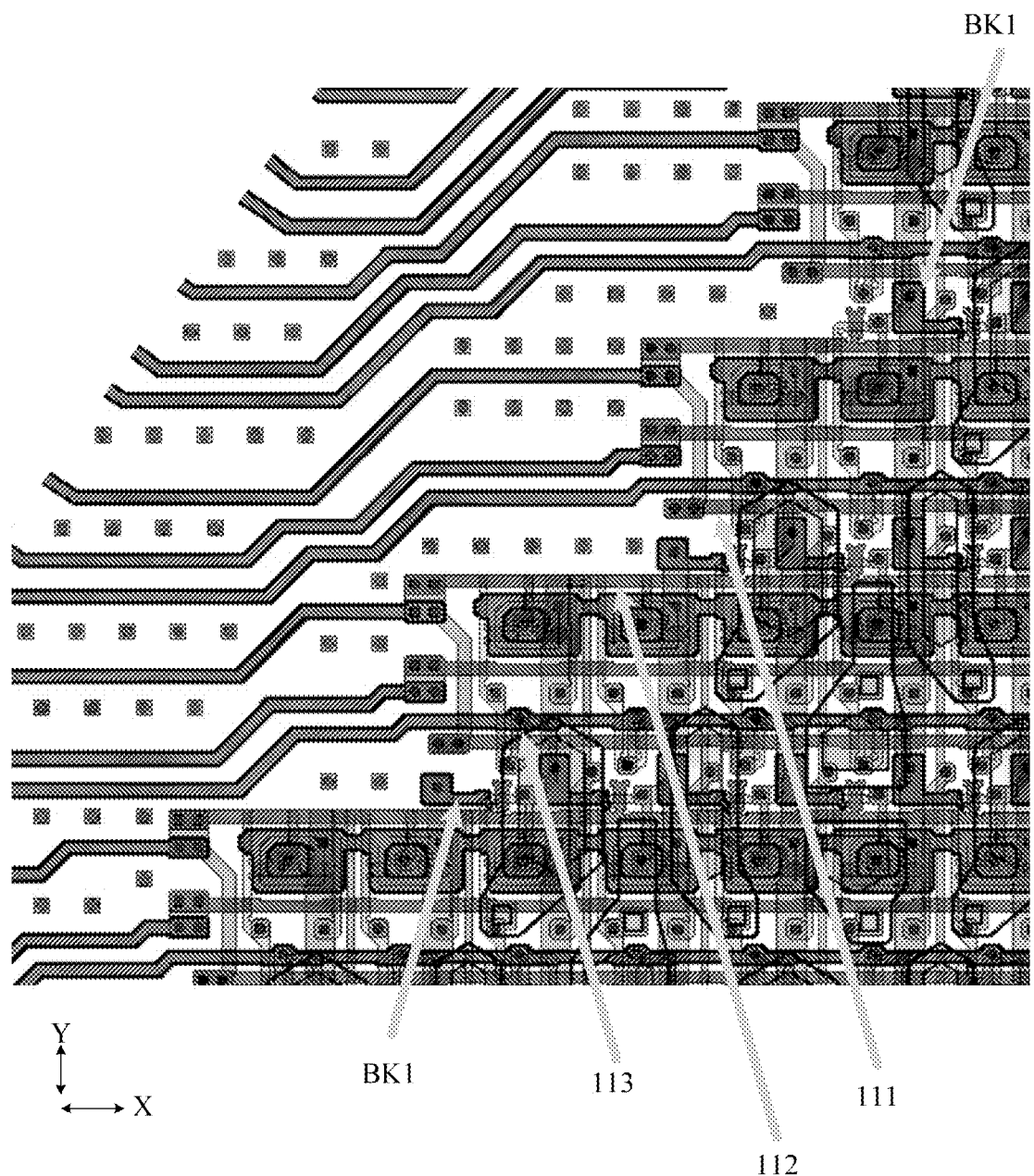
FIG. 27 is a plan view of an upper left corner of a display panel provided by an embodiment of the present disclosure.
Figure 28:
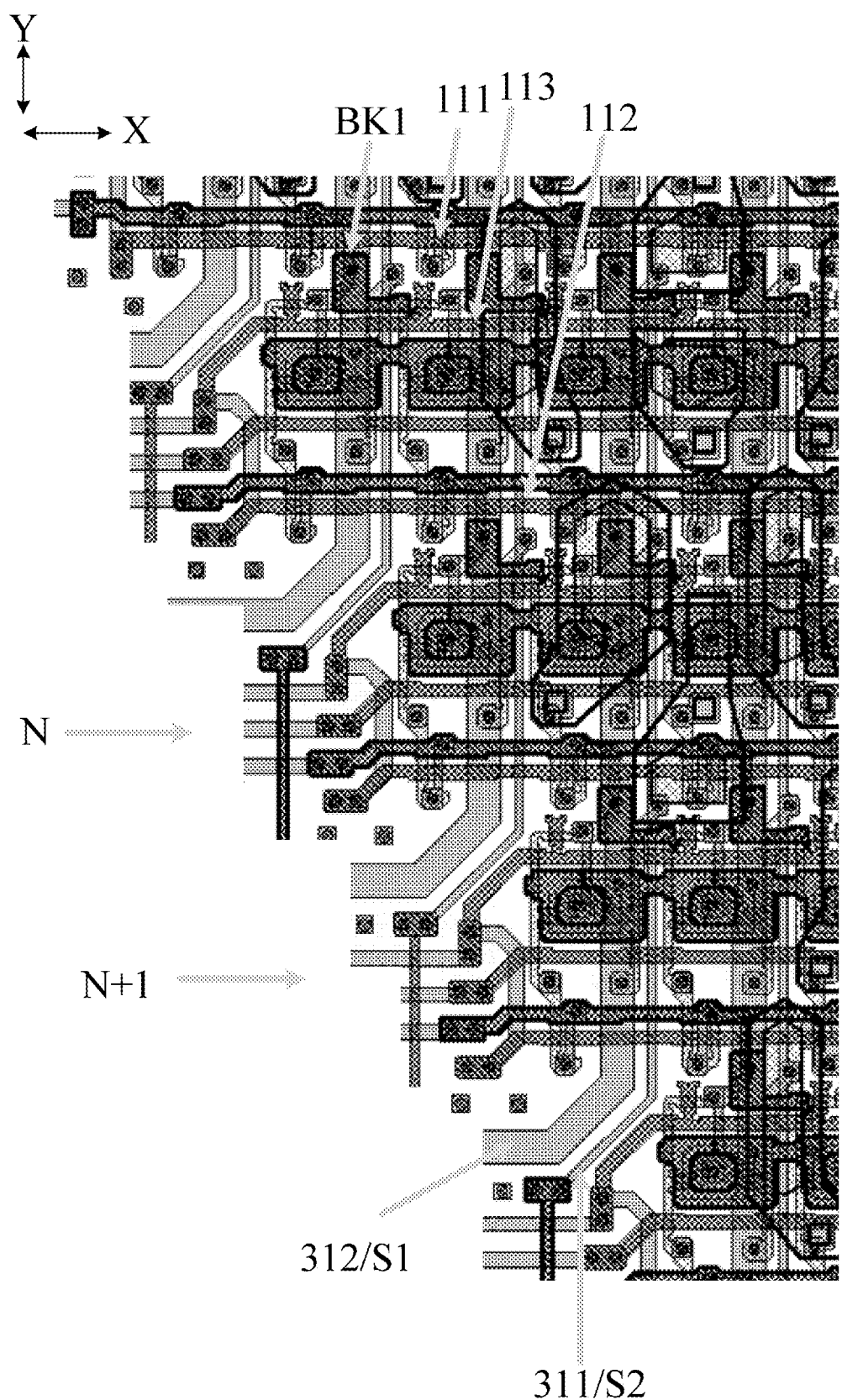
FIG. 28 is a plan view of a lower left corner of a display panel provided by an embodiment of the present disclosure.
Figure 29:
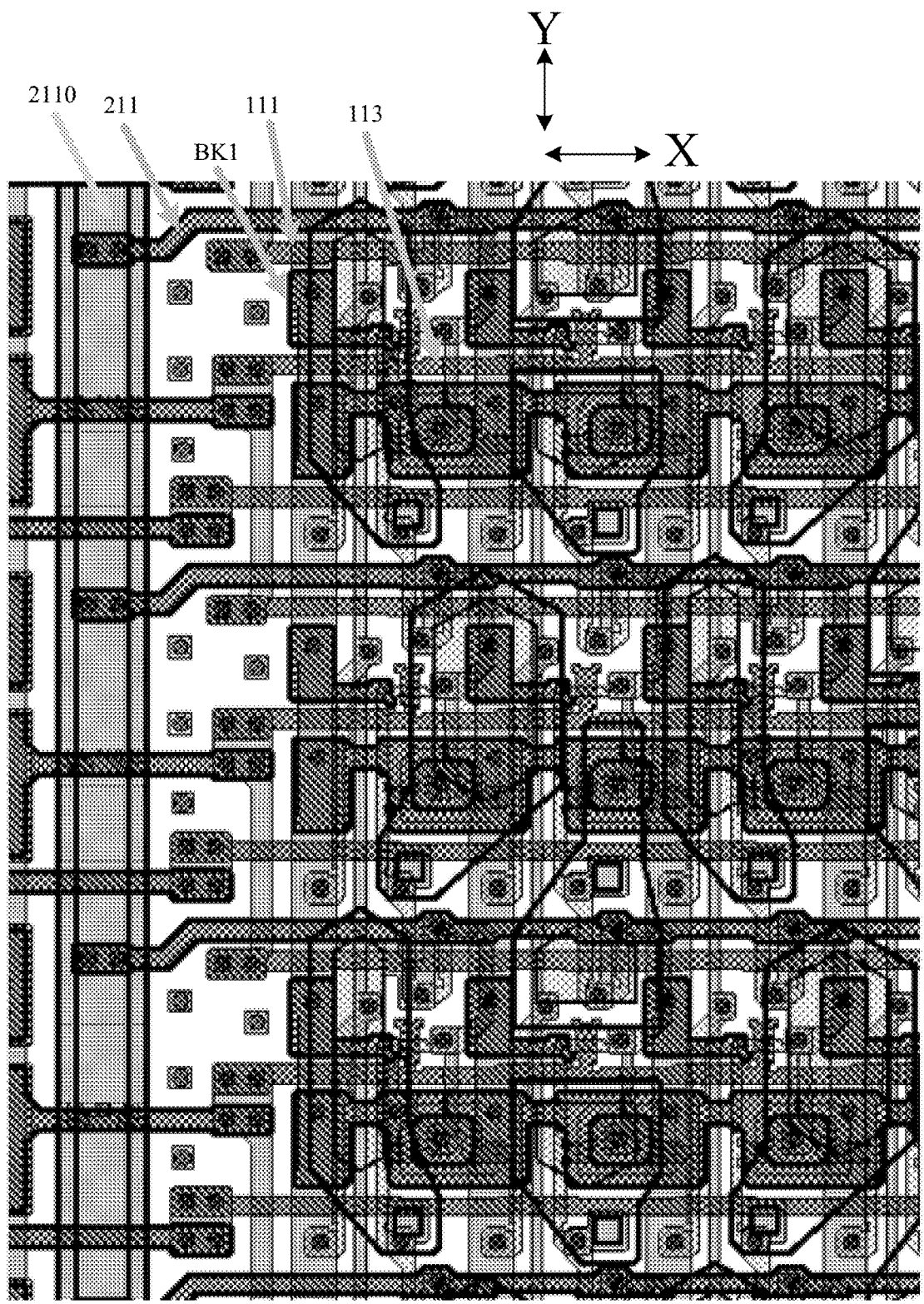
FIG. 29 is a plan view of a left side edge of a display panel provided by an embodiment of the present disclosure.

FIG. 27 to FIG. 29 are partial plan views of a display panel according to some embodiments of the present disclosure. FIG. 27 is a plan view of the upper left corner of the display panel provided by an embodiment of the present disclosure. FIG. 28 is a plan view of the lower left corner of the display panel provided by an embodiment of the present disclosure. FIG. 29 is a plan view of the left side edge of the display panel provided by an embodiment of the present disclosure. The first display pixel unit can be at least located at one position of the upper left corner, the left side edge and the lower left corner of the display panel. FIG. 27 to FIG. 29 illustrate the arrangement trend of a plurality of first conductive blocks BK1. The first conductive blocks BK1 can be arranged along the trend of the edge of the display panel. In the embodiment of the present disclosure, the first display pixel unit located at the left side is taken as an example. Of course, in the case where the threshold compensation transistor T3 in the left first display pixel unit of the display panel forms a capacitor with the second conductive block BK2, the threshold compensation transistor T3 in the right first display pixel unit can form a capacitor with the first conductive block BK1, which is not limited here. As illustrated in FIG. 28, the length of the first reset control signal line 111 in the first direction X is greater than the length of the gate line 113 in the first direction X. As illustrated in FIG. 29, the length of the first reset control signal line 111 in the first direction X is equal to the length of the gate line 113 in the first direction X.

In the embodiment of the present disclosure, the first signal line S1 includes not only the part located in the dummy region but also the part located in the display region. For example, as illustrated in FIG. 28, in the same signal line, the part located in the dummy region is called the first signal line S1, and the part located in the display region is called the first power line 312. As illustrated in FIG. 28, for the display pixel units in the $N_{th}$ row, the signal line marked with 312/S1 is the first power line 312, and the signal line marked with 311/S2 is the data line 311; while for display pixel units in the $(N+1)_{th}$ row, the signal line marked with 312/S1 is the first signal line S1 and the signal line marked with 311/S2 is the second signal line S2.

FIG. 29 also illustrates an initialization signal bus line 2110, and a plurality of initialization signal lines 211 are connected with the initialization signal bus line 2110, so as to supply initialization signals Vint to the display pixel units of a plurality of rows.

Figure 30:
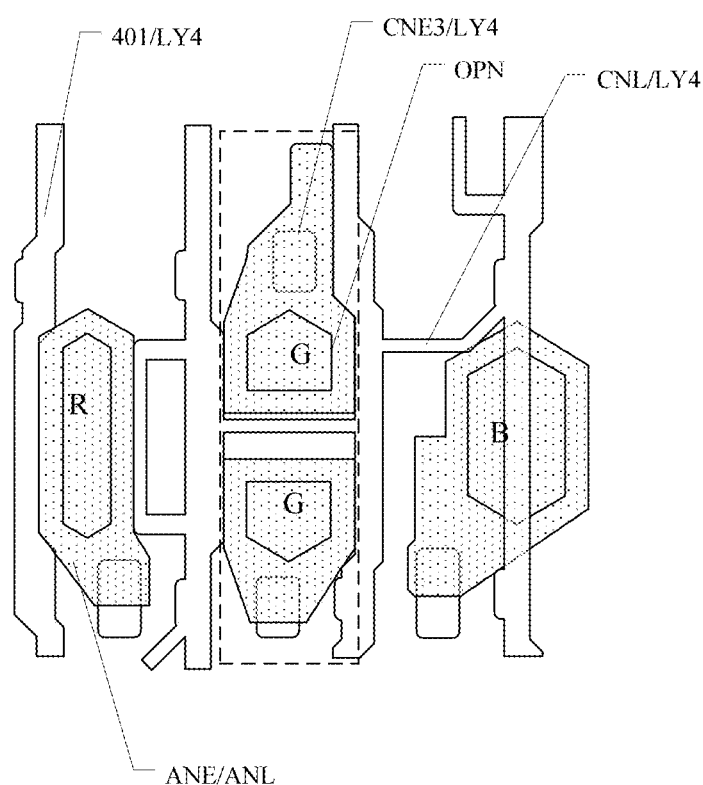
FIG. 30 is a plan view of a fourth conductive pattern layer and an anode layer in a display panel provided by an embodiment of the present disclosure.

FIG. 30 is a plan view of a fourth conductive pattern layer and an anode layer in a display panel provided by an embodiment of the present disclosure. The anode layer ANL includes four anodes ANE to form a red display pixel unit, a blue display pixel unit and two green display pixel units, respectively. The fourth conductive pattern layer LY4 includes a plurality of first conductive lines 401 extending in the second direction and connection lines CNL connecting adjacent first conductive lines 401. The connection line CNL may extend in the first direction, and the first conductive line 401 may extend in the second direction, but is not limited thereto. The first conductive line 401 is connected in parallel with the first power line to reduce resistance. FIG. 30 also illustrates the opening OPN of the pixel definition layer. In an embodiment of the present disclosure, the pixel definition layer is provided with an opening OPN for the display pixel unit, and at the dummy pixel unit, the pixel definition layer may not have an opening, so that the dummy pixel unit does not emit light.

As illustrated in FIG. 30, the fourth conductive pattern layer LY4 further includes a connection electrode CNE3. The anode ANE is connected with the connection electrode CNE3. The connection electrode CNE3 is connected with the connection electrode CEN1. That is, on the basis of FIG. 31, a connection electrode CNE3 is provided on the planarization layer PLN, a second planarization layer is formed on the connection electrode CNE3, and an anode ANE is formed on the second planarization layer. The anode ANE is connected with the connection electrode CNE3 through a via hole penetrating the second planarization layer, and the connection electrode CNE3 is connected with the connection electrode CEN1 through a via hole penetrating the planarization layer PLN and the passivation layer PVX, the rest can refer to the structure of FIG. 31.

In the embodiment of the present disclosure, the shape of the anode ANE is not limited to that illustrated in the figure, and other shapes can be adopted as required.

In the embodiment of the present disclosure, the first conductive pattern layer LY1 is formed by the same film layer using the same patterning process, the second conductive pattern layer LY2 is formed by the same film layer using the same patterning process, the third conductive pattern layer LY3 is formed by the same film layer using the same patterning process, and the fourth conductive pattern layer LY4 is formed by the same film layer using the same patterning process.

Referring to FIG. 23, in the plan view, the first conductive block BK1 partially overlaps with the anode ANE. For example, considering that there is a signal access terminal around the dummy pixel unit, in order to have enough wiring space, in the plan view, the fourth conductive pattern layer LY4 does not overlap with the dummy pixel unit.

Figure 31:
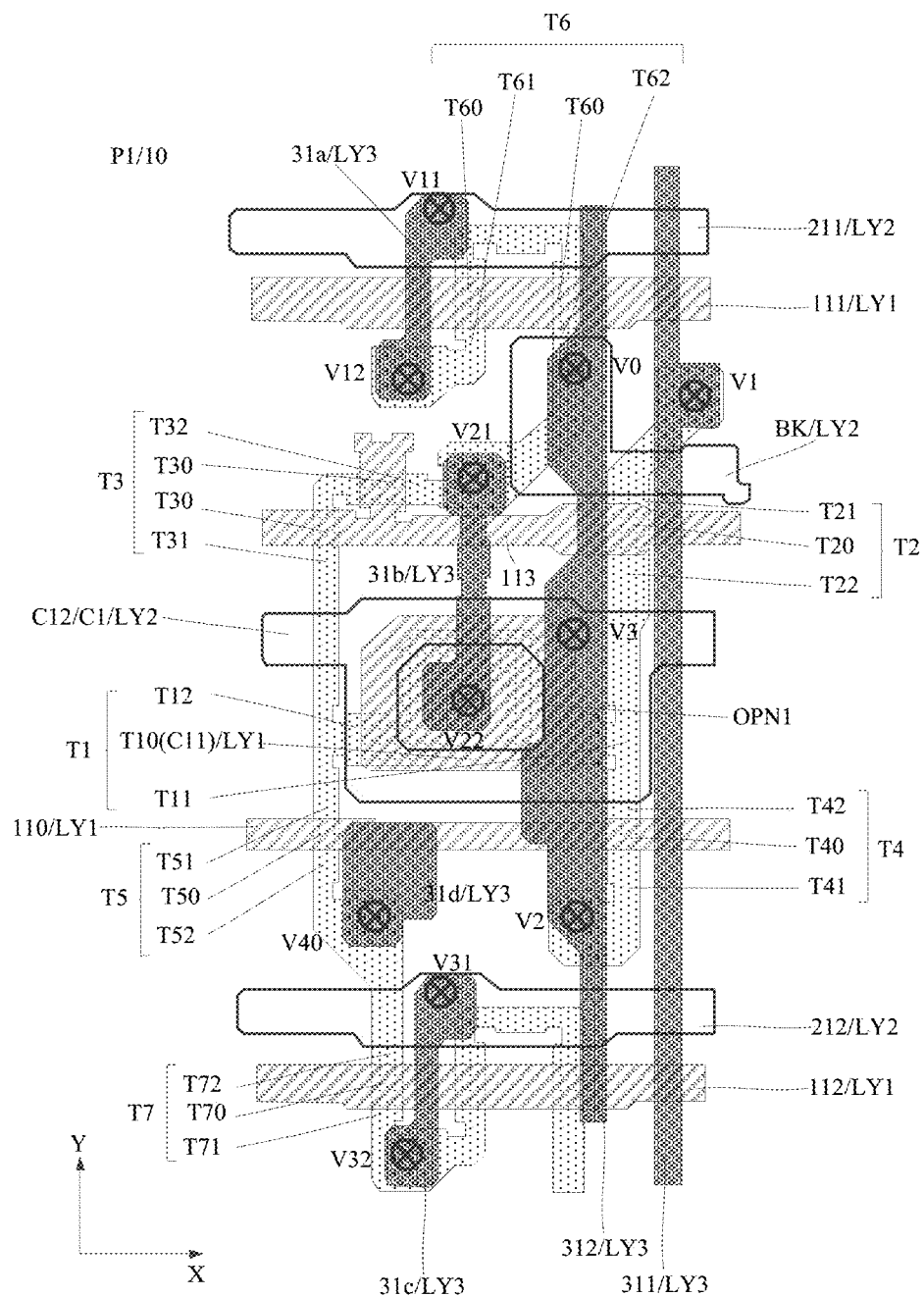
FIG. 31 is a schematic plan view of a display panel provided by an embodiment of the present disclosure.

FIG. 31 is a schematic plan view of a display panel provided by an embodiment of the present disclosure. Compared with the display panel illustrated in FIG. 3, in the display panel illustrated in FIG. 31, in order to reduce parasitic capacitance, the first power signal line 311 is narrowed at the position overlapping with the signal line extending in a horizontal direction. For example, the first power signal line 311 is narrowed at its position overlapping with the gate line 113.

In the embodiment of the present disclosure, a plan view of the display panel can refer to a top view of the display panel.

At least one embodiment of the present disclosure further provides a display device, including any of the above display panels.

For example, the display device includes OLED display devices or any products or devices including the OLED display devices and having display functions, such as computers, mobile phones, watches, electronic picture frames and navigators.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. A display panel, comprising:
a display pixel unit located in a display region, the display pixel unit comprising a first transistor, the first transistor comprising a first channel and a second channel, the first channel and the second channel being connected by a conductive connection portion;
a dummy pixel unit located in a dummy region, the dummy region being at a side of the display region and being a non-light-emitting region;
a first signal line located in the dummy region, the first signal line being configured to supply a constant voltage; and
a first conductive block connected with the first signal line,
wherein the display pixel unit comprises a first display pixel unit, the first display pixel unit is a display pixel unit adjacent to the dummy pixel unit in a row direction, and in a plan view of the display panel, the first conductive block at least partially overlaps with the conductive connection portion of the first transistor of the first display pixel unit.

2. The display panel according to claim 1, wherein the dummy pixel unit is not provided with the first transistor.

3. The display panel according to claim 1, further comprising an interlayer insulating layer, wherein the interlayer insulating layer is located between the first conductive block and the first signal line, and the first conductive block is connected with the first signal line through a via hole penetrating the interlayer insulating layer.

4. The display panel according to claim 1, further comprising:
a first power line located in the display region and in a same layer as the first signal line; and
a second conductive block located in the display region and in a same layer as the first conductive block, the second conductive block being connected with the first power line,
wherein the display pixel unit comprises a second display pixel unit, the second display pixel unit is located at a side of the first display pixel unit away from the dummy pixel unit, in a plan view of the display panel, the second conductive block at least partially overlaps with the conductive connection portion of the first transistor of the second display pixel unit, and the first signal line and the first power line are arranged in a first direction, the first signal line and the first power line both extend in a second direction, and a size of the first conductive block in the second direction is less than or equal to a size of the second conductive block in the second direction.

5. The display panel according to claim 4, wherein the first signal line is connected with the first power line, and the first power line is configured to supply the constant voltage to the display pixel unit.

6. The display panel according to claim 4, wherein the second direction intersects with the first direction.

7. The display panel according to claim 1, further comprising a gate line and a first reset control signal line,
wherein the first transistor further comprises a first gate electrode and a second gate electrode, the first gate electrode and the second gate electrode are connected with the gate line, respectively, and the first gate electrode and the second gate electrode overlap with the first channel and the second channel, respectively, in a direction perpendicular to the display panel,
the gate line and the first reset control signal line both extend in a first direction, the first display pixel unit is a display pixel unit closest to an edge of the display panel in the first direction, the first reset control signal line and the gate line are arranged in a second direction, the first reset control signal line is closer to an edge of the display panel than the gate line, the first direction intersects with the second direction, and a length of the first reset control signal line in the first direction is less than or equal to a length of the gate line in the first direction.

8. The display panel according to claim 7, further comprising a conductive adapter, wherein the conductive adapter is connected with the first reset control signal line, and the conductive adapter is located in a same layer as the first signal line.

9. The display panel according to claim 1, further comprising an initialization signal line, wherein the initialization signal line extends in a first direction, and the first conductive block is located in a same layer as the initialization signal line.

10. The display panel according to claim 1, further comprising a pixel definition layer, wherein the pixel definition layer has an opening in the display region, the opening is configured to define a light-emitting region of the display pixel unit, and the pixel definition layer is not provided with an opening for the dummy pixel unit.

11. The display panel according to claim 1, further comprising an anode layer, wherein the anode layer comprises an anode, the display pixel unit has the anode, and the dummy pixel unit is not provided with an anode.

12. The display panel according to claim 1, wherein the first display pixel unit is located at a side edge of the display panel or at a corner of the display panel.

13. The display panel according to claim 1, further comprising a driving transistor, wherein a first electrode of the first transistor is electrically connected with a second electrode of the driving transistor, a second electrode of the first transistor is electrically connected with a gate electrode of the driving transistor, and a gate electrode of the first transistor is electrically connected with a gate line.

14. The display panel according to claim 13, further comprising a gate line, a data line, a light-emitting control signal line, a first power line, a second power line, a first reset control signal line, a second reset control signal line, a first initialization signal line, and a second initialization signal line, wherein the display pixel unit further comprises a light-emitting element, a data writing transistor, a first light-emitting control transistor, a second light-emitting control transistor, a first reset transistor, a second reset transistor, and a storage capacitor,
a first electrode of the storage capacitor is electrically connected with the first power line, and a second electrode of the storage capacitor is electrically connected with the second electrode of the first transistor;
a gate electrode of the data writing transistor is electrically connected with the gate line, and a first electrode and a second electrode of the data writing transistor are electrically connected with the data line and the first electrode of the driving transistor, respectively;
the gate electrode of the first transistor is electrically connected with the gate line, the first electrode of the first transistor is electrically connected with the second electrode of the driving transistor, and the second electrode of the first transistor is electrically connected with the gate electrode of the driving transistor;
a gate electrode of the first light-emitting control transistor and a gate electrode of the second light-emitting control transistor are both connected with the light-emitting control signal line;
a first electrode and a second electrode of the first light-emitting control transistor are electrically connected with the first power line and the first electrode of the driving transistor, respectively; a first electrode and a second electrode of the second light-emitting control transistor are electrically connected with the second electrode of the driving transistor and the first electrode of the light-emitting element, respectively; and the second electrode of the light-emitting element is electrically connected with the second power line;
a gate electrode of the first reset transistor is electrically connected with the first reset control signal line, a first electrode of the first reset transistor is electrically connected with the first initialization signal line, and a second electrode of the first reset transistor is electrically connected with the gate electrode of the driving transistor;
a gate electrode of the second reset transistor is electrically connected with the second reset control signal line, a first electrode of the second reset transistor is electrically connected with the second initialization signal line, and a second electrode of the second reset transistor is electrically connected with the first electrode of the light-emitting element.

15. The display panel according to claim 14, wherein the dummy pixel unit is not provided with at least one of the first reset transistor and the second reset transistor.

16. The display panel according to claim 15, further comprising a first lead wire and a second lead wire, wherein the first lead wire and the second lead wire are located at a side of the dummy pixel unit away from the display pixel unit, the first lead wire is connected with the gate line and the second reset control signal line, respectively, and the second lead wire is connected with the light-emitting control signal line.

17. The display panel according to claim 1, further comprising a gate insulating layer, wherein the gate insulating layer is located between the first conductive block and the conductive connection portion as a dielectric of a capacitor formed by the first conductive block and the conductive connection portion.

18. A display device comprising the display panel according to claim 1.

19. The display panel according to claim 1, further comprising:
a first power line located in the display region and in a same layer as the first signal line; and
a second conductive block located in the display region and in a same layer as the first conductive block, the second conductive block being connected with the first power line,
wherein the display pixel unit comprises a second display pixel unit, the second display pixel unit is located at a side of the first display pixel unit away from the dummy pixel unit, in a plan view of the display panel, the second conductive block at least partially overlaps with the conductive connection portion of the first transistor of the second display pixel unit, and the first signal line and the first power line are arranged in a first direction, the first signal line and the first power line both extend in a second direction, and a maximum size of the first conductive block in the second direction is less than a maximum size of the second conductive block in the second direction.

20. The display panel according to claim 17, wherein the gate insulating layer comprises a first gate insulating layer and a second gate insulating layer.

* * * * *